United States Patent
Hinojosa et al.

(10) Patent No.: US 11,432,429 B2
(45) Date of Patent: Aug. 30, 2022

(54) ADJUSTABLE BARRIER FOR ENCLOSURES

(71) Applicant: Hoffman Enclosures, Inc., Anoka, MN (US)

(72) Inventors: Gerardo Villegas Hinojosa, Reynosa (MX); Alejandro Usiel Hernandez Villa, Reynosa (MX); Omar Alejandro Rodriguez Perez, Reynosa (MX); Selene Hernandez Ariguznaga, Reynosa (MX)

(73) Assignee: Hoffman Enclosures Inc., Anoka, MN (US)

( * ) Notice: Subject to any disclaimer, the term of this patent is extended or adjusted under 35 U.S.C. 154(b) by 294 days.

(21) Appl. No.: 16/867,178

(22) Filed: May 5, 2020

(65) Prior Publication Data

US 2021/0352820 A1 Nov. 11, 2021

(51) Int. Cl.
*H05K 7/18* (2006.01)
*H05K 5/02* (2006.01)

(52) U.S. Cl.
CPC ........... *H05K 7/183* (2013.01); *H05K 5/0217* (2013.01)

(58) Field of Classification Search
CPC ...... H05K 5/0217; H05K 5/04; H05K 7/1488; H05K 7/18; H05K 7/183; H05K 7/14; H05K 7/1401; H05K 7/1485; H05K 7/1417; H05K 7/1474; H05K 7/20572; H05K 9/0037
See application file for complete search history.

(56) References Cited

U.S. PATENT DOCUMENTS

| | | | |
|---|---|---|---|
| 5,145,243 | A | 9/1992 | Liu |
| 5,574,251 | A | 11/1996 | Sevier |
| 5,735,411 | A | 4/1998 | Flamme et al. |
| 5,889,648 | A | 3/1999 | Heavirland et al. |
| 5,944,397 | A | 8/1999 | Zeitler |
| 5,975,659 | A | 11/1999 | Yang et al. |
| 6,047,501 | A | 4/2000 | Zeitler |
| 6,066,802 | A | 5/2000 | Reinke et al. |
| 6,234,592 | B1 | 5/2001 | Liu et al. |
| 6,271,467 | B1 | 8/2001 | Book et al. |
| 6,366,448 | B1 | 4/2002 | Berndt et al. |
| 6,414,241 | B1 | 7/2002 | O'Donnell |
| 6,667,438 | B2 | 12/2003 | Schneider et al. |

(Continued)

FOREIGN PATENT DOCUMENTS

| | | |
|---|---|---|
| CN | 202772474 U | 3/2013 |
| CN | 107017576 A | 8/2017 |

(Continued)

*Primary Examiner* — Andrew M Roersma
(74) *Attorney, Agent, or Firm* — Quarles & Brady LLP

(57) ABSTRACT

Embodiments of the invention provide an adjustable barrier assembly for enclosure, and related methods of installation. The adjustable barrier assembly includes a barrier panel that includes a first panel slidable relative to a second panel to accommodate different depths of different enclosures. The assembly further includes a top support bracket, an upper barrier plate, a bottom support bracket, and a lower barrier plate. Each of the upper barrier plate and the lower barrier plate can be secured to the top support bracket and the bottom support bracket, respectively, at different relative orientations in order to accommodate different heights of different enclosures.

20 Claims, 16 Drawing Sheets

(56) References Cited

U.S. PATENT DOCUMENTS

| | | |
|---|---|---|
| 6,870,731 B2 | 3/2005 | Lin et al. |
| 7,697,285 B2 | 4/2010 | Donowho et al. |
| 7,746,637 B2 | 6/2010 | Donowho et al. |
| 7,839,635 B2 | 11/2010 | Donowho et al. |
| 7,894,190 B2 * | 2/2011 | Davis ................. H05K 7/20736 |
| | | 361/695 |
| 8,210,490 B2 | 7/2012 | Mattlin et al. |
| 8,254,089 B2 | 8/2012 | Cosley et al. |
| 8,353,492 B2 | 1/2013 | Mattlin et al. |
| 8,405,984 B2 | 3/2013 | Donowho et al. |
| 8,459,756 B2 | 6/2013 | Linhares, Jr. et al. |
| 8,528,872 B2 | 9/2013 | Mattlin et al. |
| 8,787,023 B2 | 7/2014 | Lewis, II et al. |
| 8,901,438 B2 | 12/2014 | Lewis, II et al. |
| 9,055,677 B2 | 6/2015 | Garza, Jr. et al. |
| 9,408,326 B2 | 8/2016 | Lewis, II et al. |
| 9,642,270 B2 | 5/2017 | Lewis, II et al. |
| 9,814,159 B2 | 11/2017 | Lewis, II et al. |
| 9,913,534 B2 | 3/2018 | Anderson et al. |
| 9,955,616 B2 * | 4/2018 | Krietzman ......... H05K 7/20745 |
| 9,980,400 B2 | 5/2018 | Lewis, II et al. |
| 10,178,784 B2 | 1/2019 | Lewis, II et al. |
| 10,237,994 B2 | 3/2019 | Donowho et al. |
| 10,455,744 B2 * | 10/2019 | Grinberg ............ H05K 7/20572 |
| 10,863,646 B1 * | 12/2020 | Rampey ................. A47B 61/02 |
| 2011/0316402 A1 | 12/2011 | Hsiao |
| 2012/0062086 A1 | 3/2012 | Garza, Jr. et al. |
| 2012/0062091 A1 | 3/2012 | Donowho et al. |
| 2012/0063099 A1 | 3/2012 | Alaniz et al. |
| 2013/0309005 A1 | 11/2013 | Barrett |
| 2014/0319084 A1 | 10/2014 | Lewis, II et al. |
| 2015/0259938 A1 * | 9/2015 | Bernard ............... A47B 87/008 |
| | | 52/64 |
| 2017/0034947 A1 * | 2/2017 | Anderson ........... H05K 7/1488 |
| 2018/0027677 A1 | 1/2018 | Garza, Jr. et al. |
| 2019/0215973 A1 | 7/2019 | Donowho et al. |

FOREIGN PATENT DOCUMENTS

| | | |
|---|---|---|
| CN | 206742727 U | 12/2017 |
| CN | 207339015 U | 5/2018 |
| EP | 0798953 B1 | 8/2003 |
| FR | 2695763 B1 | 3/1994 |

* cited by examiner

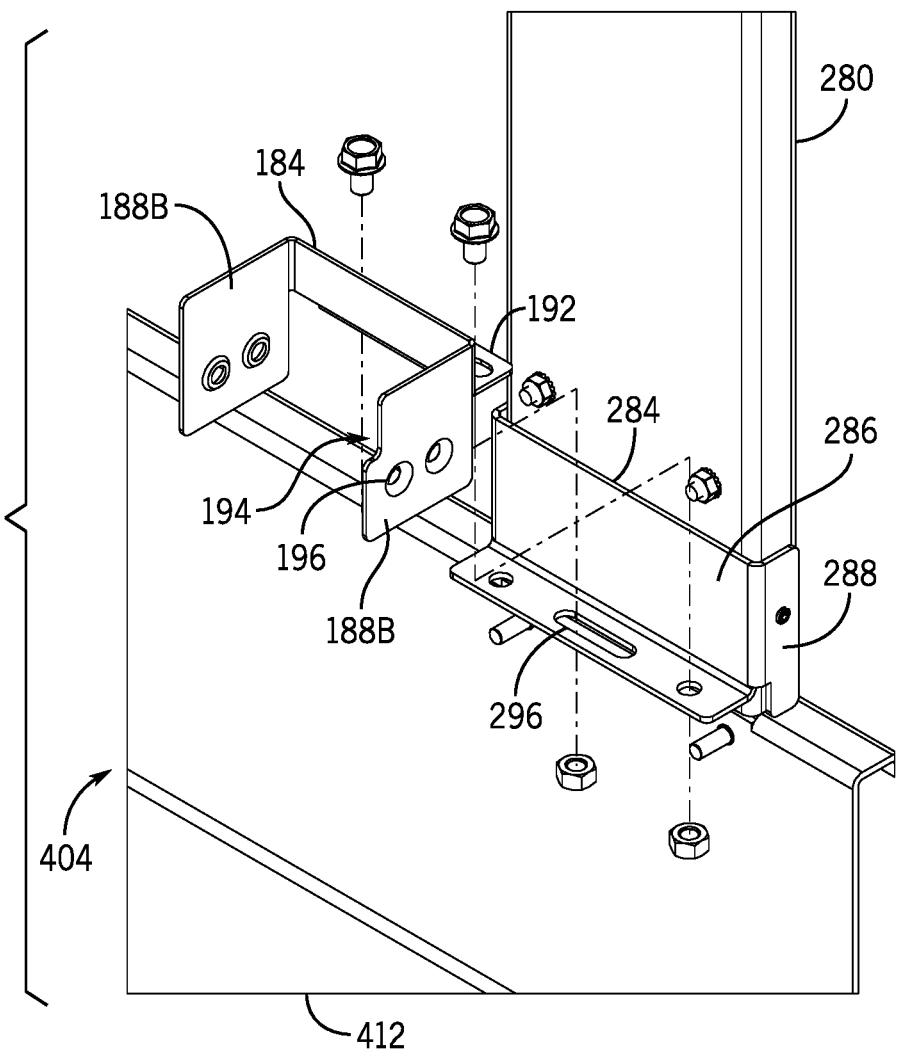
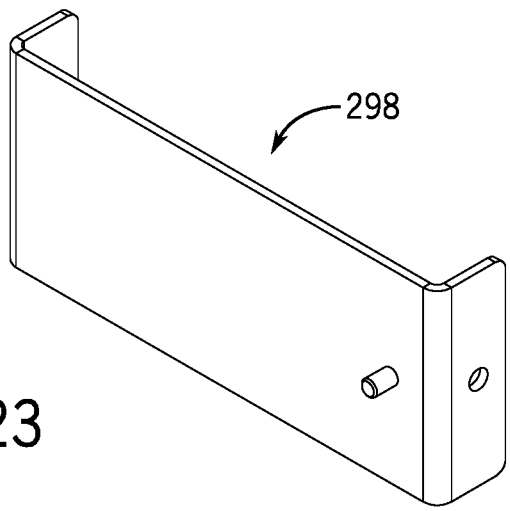

ADJUSTABLE BARRIER FOR ENCLOSURES

RELATED APPLICATIONS

Not applicable.

BACKGROUND

Electrical equipment can be installed in enclosures that are configured to allow users to access the equipment. In some cases, it may be useful to separate a particular enclosure into relatively separate compartments. For example, it may be useful to separate an enclosure into a first compartment for higher voltage equipment and a second compartment for lower voltage equipment.

SUMMARY

Some embodiments of the invention provide an adjustable barrier assembly for enclosure, and related methods of installation. The adjustable barrier assembly includes a barrier panel that includes a first panel slidable relative to a second panel to accommodate different depths of different enclosures. The assembly further includes a top support bracket, an upper barrier plate, a bottom support bracket, and a lower barrier plate. Each of the upper barrier plate and the lower barrier plate can be secured to the top support bracket and the bottom support bracket, respectively, at different relative orientations in order to accommodate different heights of different enclosures.

In one embodiment, an adjustable barrier assembly is provided for an enclosure that has any of a plurality of enclosure depths and enclosure heights. The adjustable barrier assembly can include a top support bracket configured to be secured to the enclosure, a bottom support bracket configured to be secured to the enclosure, and a barrier panel assembly including a first barrier panel and a second barrier panel. The second barrier panel can be slidably secured to the first barrier panel to selectively accommodate the plurality of enclosure depths. An upper barrier plate can include a first elongated upper-plate mounting hole that extends vertically and can be configured to secure the upper barrier plate to the top support bracket to selectively accommodate the plurality of enclosure heights, and a flange configured to secure a first end of the barrier panel assembly. A lower barrier plate can include a first elongated lower-plate mounting hole that extends vertically and is configured to secure the lower barrier plate to the bottom support bracket to selectively accommodate the plurality of enclosure heights. An upstanding wall having slots at a base thereof can secure a second end of the barrier panel assembly. The barrier panel assembly, the upper barrier plate, and the lower barrier plate can be configured to collectively adjustably divide the enclosure into separate interior portions.

In one embodiment, an adjustable barrier assembly is provided for selective use with any of a plurality of enclosures. The adjustable barrier assembly can include a first barrier panel, a second barrier panel slidably secured to the first barrier panel to selectively accommodate multiple enclosure depths, a top support bracket configured to be secured at a top portion of an enclosure, an upper barrier plate secured to the top support bracket using elongated mounting holes to selectively accommodate multiple enclosure top-portion heights, a bottom support bracket configured to be secured at a bottom portion of the enclosure, and a lower barrier plate secured to the bottom support bracket using elongated mounting holes to selectively accommodate multiple enclosure bottom-portion heights. The first barrier panel can be configured to be secured to the upper and lower barrier plates after the top and bottom support brackets secure the upper and lower barrier plates within the enclosure.

In one embodiment, a method of installing an adjustable barrier in an enclosure is provided. The method can include securing a base arm of a top support bracket to a centerpost of an enclosure at a top portion of the enclosure and securing an upper barrier plate to a support arm of the top support bracket so that the upper barrier plate extends substantially fully across a top-portion depth of the enclosure above a top of the centerpost of the enclosure. The method can further include securing a base flange of a bottom support bracket to the centerpost of the enclosure at a bottom portion of the enclosure and securing a lower barrier plate to a support arm of the bottom support bracket such that the lower barrier plate extends substantially fully across a bottom-portion depth of the enclosure below a bottom of the centerpost of the enclosure. The method can also include inserting tabs of a first barrier panel into slots disposed in the lower barrier plate, pivoting the first barrier panel relative to the tabs to engage pins of the first barrier panel with recesses disposed in the upper barrier plate, and adjusting a second barrier panel that is slidably engaged with the first barrier panel such that the first barrier panel and the second barrier panel together extend substantially fully across a middle-portion depth of the enclosure.

BRIEF DESCRIPTION OF THE DRAWINGS

The accompanying drawings, which are incorporated in and form a part of this specification, illustrate embodiments of the invention and, together with the description, serve to explain the principles of embodiments of the invention:

FIG. 22 is a partially exploded partial view of the enclosure of FIG. 19, further including the bottom support bracket of FIG. 4 according to one embodiment of the invention.

FIG. 23 is an isometric view of an inner support anchor of the adjustable barrier assembly according to one embodiment of the invention.

DETAILED DESCRIPTION

Figure 1:
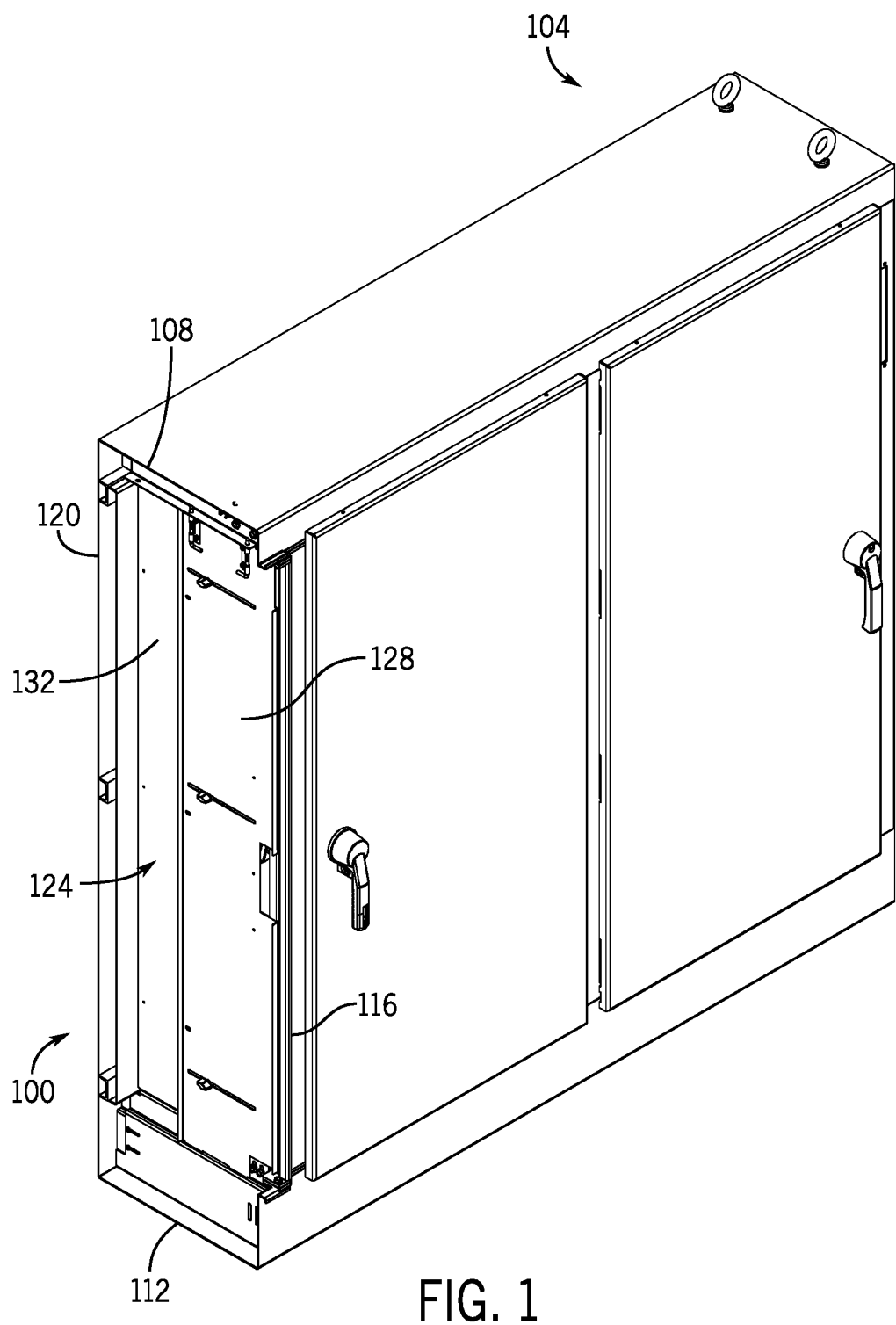
FIG. 1 is a partial cross-sectional isometric view of a three-door free-standing enclosure with an adjustable barrier assembly according to one embodiment of the invention.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Likewise, the phrases "at least one of A, B, and C," "one or more of A, B, and C," and the like, are meant to indicate A, or B, or C, or any combination of A, B, and/or C.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

As used herein relative to distances, unless otherwise limited or defined, "substantially fully" indicates at least 90% of an associated distance. In some embodiments, "substantially fully" indicates over 95% or more of an associated distance. In some embodiments, "substantially fully" also indicates a portion of a distance that provides finger-safe coverage. For example, a panel extending substantially fully across a depth of an enclosure from front to back to define separated compartments of the enclosure may extend across the depth to a sufficient extent to prevent a user from extending a finger across the panel between the separated compartments of the enclosure.

Also as used herein, unless otherwise limited or defined, "depth" in the context of an enclosure refers to a dimension of the enclosure extending from a front side to a back side. For example, some enclosures may exhibit a total depth that can be measured from a front opening or door of the enclosure to a rear wall or rear panel of the enclosures. Similarly, "height" in the context of an enclosure refers to a dimension of the enclosure extending from a top side to a bottom side. For example, some enclosures may exhibit a total height that can be measured from a top wall of the enclosure to a floor of the enclosure. In some cases, an enclosure "depth" or "height" can vary between different parts of an enclosure. For example, some enclosure depths may be larger at top or bottom portions of the enclosure than at middle portions of the enclosure due to the inclusion of a rear panel that extends along part of a rear wall of the enclosure. In some cases, "height" or "depth" can refer to the dimension of a part of an enclosure, including, for example, a top-portion or bottom-portion height above or below a particular reference, such as the top or bottom of a centerpost or other feature.

As discussed above, it can be generally useful to divide enclosures into relatively separate compartments. For example, for an enclosure that houses both higher voltage equipment (e.g., 50 volts and higher) and lower voltage equipment (e.g., lower than 50 volts), it may be useful to separate the enclosure into at least one distinct compartment for the higher voltage equipment and at least one distinct compartment for the lower voltage equipment.

In some installations, providing separate compartments for higher and lower voltage equipment can be useful for a number of reasons. For example, particular types of personal protective equipment and procedures may be required for users to access higher voltage equipment, whereas other (e.g., less complicated or rigorous) types of personal protective equipment and procedures may be required for users to access lower voltage equipment. Accordingly, when higher and lower voltage equipment are appropriately separated, users may be able to access the lower voltage equipment without being required to utilize personal protective equipment and procedures that may be required for higher voltage equipment.

Conventional systems for separating enclosures into separate compartments utilize painted or galvanized barriers that are mounted vertically to the centerposts of the enclosures (e.g., to the centerposts of relatively large multi-door enclosures). While these systems can usefully separate the enclosures into separate compartments, they may offer relatively limited flexibility. For example, there may be little flexibility in the method of mounting the barriers, whether to the centerposts themselves, or to other structural features of the relevant enclosures. As another example, for each different size (or other configuration) of enclosure, customers may be required to purchase (or keep in inventory) a different size of barrier, or customized extension equipment. Further, in many cases, conventional barriers do not provide, or do not easily provide, desired protective ratings (e.g., according to NEMA Type 1 guidelines). For example, it may be difficult to ensure that conventional barrier systems provide finger-safe barriers—i.e., provide gaps through a barrier between compartments that are too small for a user to extend a finger through.

In some conventional approaches, it may also be possible to bay separate enclosures together, in order to effectively create separate compartments for different types of equipment (e.g., higher and lower voltage equipment). In this type of installation, for example, the walls of the enclosures themselves can provide barriers between different types of equipment. In some cases, however, this type of baying may not be practical (or even possible) or may be relatively expensive to implement.

In some embodiments, barriers configured according to the invention can address these (or other) issues. For example, in some embodiments, a barrier assembly according to the invention can provide for adjustable separation of an enclosure into separate compartments. In some cases, a barrier assembly according to the invention can be highly adjustable, allowing for installation in a variety of enclosure types, sizes (e.g., different enclosure heights or depths), and other configurations (e.g., enclosures with single or multiple back panels of various sizes), without requiring the purchase or management of a large number of components. In some cases, a barrier assembly according to the invention can satisfy Type 1 (or other) rating requirements. For example, some embodiments of a barrier assembly according to the invention can provide for sufficiently small gaps between the barrier and the walls (or other features) of an enclosure to prevent users from inserting fingers past the barrier (e.g., from one compartment of an enclosure to another compartment of the enclosure).

FIG. 1 illustrates an adjustable voltage barrier assembly 100 according to one embodiment of the invention. In the illustrated example, the barrier assembly 100 is installed within an enclosure 104. As shown, the enclosure 104 is a three-door free-standing enclosure. However, other configurations are possible. For example, some enclosures that employ adjustable voltage barrier assemblies according to embodiments of the invention may include more than two doors.

The enclosure 104 generally defines a top portion 108, a bottom portion 112, a front portion 116, and a rear portion 120. The enclosure 104 further defines an interior volume that can be segmented by the barrier assembly 100. Generally, the barrier assembly 100 is configured to separate the enclosure 104 (and other enclosures) into separate compartments. As noted above, this can be useful, for example, in order to separate lower voltage equipment from higher voltage equipment.

In the illustrated embodiment, the barrier assembly 100 includes a barrier panel assembly 124 that is secured within the enclosure 104 via various mounting components that will be described in detail below. The barrier panel assembly 124 includes a first barrier panel 128 and a second barrier panel 132 that are configured to slide relative to one another. The slidable engagement of the first barrier panel 128 and the second barrier panel 132 allows the barrier assembly 100 to provide separation in a variety of enclosures with a variety of depths. As such, the barrier panel assembly 124 extends substantially fully between the front portion 116 and the rear portion 120 of the enclosure 104 as shown and can also be adjusted to extend substantially fully across other configurations of the enclosure 104, or across other enclosures. The adjustability of the first barrier panel 128 and the second barrier panel 132 will be described in further detail below with reference to FIG. 6.

Figure 2:
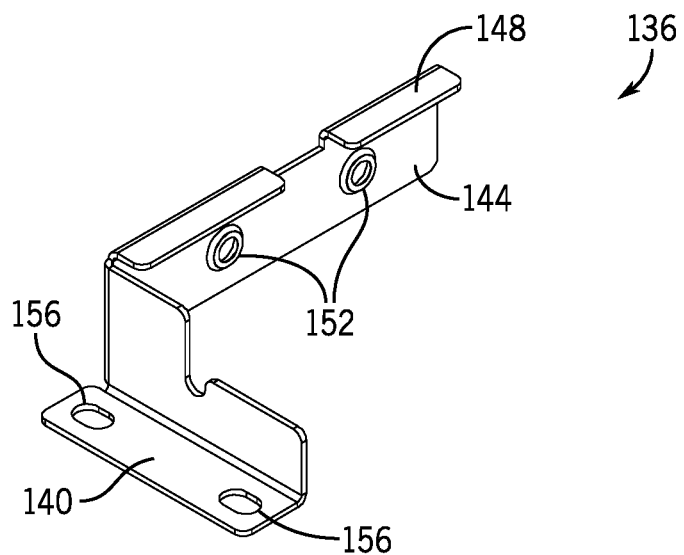
FIG. 2 is an isometric view of a top support bracket of the adjustable barrier assembly of FIG. 1 according to one embodiment of the invention.

FIGS. 2-8 illustrate various examples of mounting components of the barrier assembly 100. In particular, FIG. 2 illustrates a top support bracket 136 according to one embodiment of the invention. The top support bracket 136 includes a base arm 140 and a support arm 144 that extend generally perpendicular to one another. Additionally, a mounting flange of the base arm 140 is vertically offset from the support arm 144. The support arm 144 includes a support flange 148 that extends along the support arm 144 that can provide additional structural rigidity to the support arm 144.

As further described below, the base arm 140 and the support arm 140 can be used to secure other components of the barrier assembly 100 to an enclosure. In some embodiments, other features can also be included. For example, in the illustrated embodiment, the support flange 148 includes a gap that separates the support flange 148 into two segments. The gap is dimensioned to allow an inner rail or flange of an enclosure to pass therethrough. In other embodiments, however, a support flange may extend the full length of a support arm or have a differently configured gap. As illustrated, the support arm 144 further includes mounting holes 152 and the base arm includes mounting holes 156. These features of the top support bracket 136, and the features of the components of the barrier assembly 100 described in FIGS. 2-8, will be further characterized below, with respect to the installation of the barrier assembly 100, with reference to FIGS. 9-17.

Figure 3:
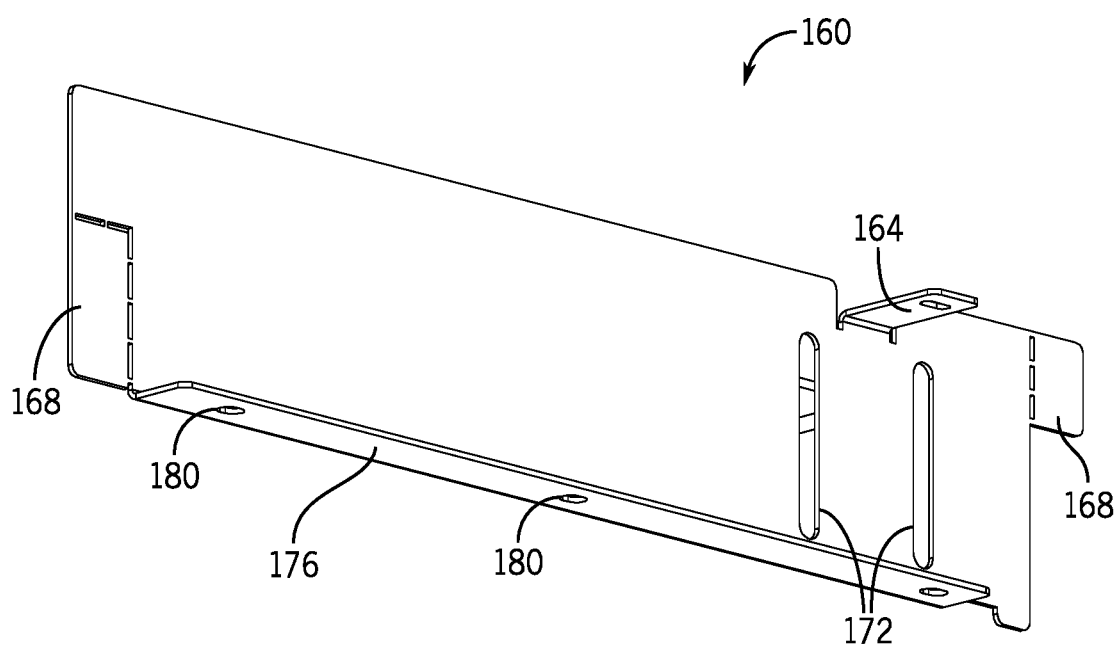
FIG. 3 is an isometric view of an upper barrier plate of the adjustable barrier assembly of FIG. 1 according to one embodiment of the invention.

Referring now to FIG. 3, an upper barrier plate 160 according to one embodiment of the invention is illustrated.

The upper barrier plate 160 includes a bent tab 164 at an upper edge, breakaway tabs 168, elongated mounting holes 172 configured as closed-end, rounded slots, and a horizontal flange 176 at a lower edge. The bent tab 164 is configured to provide a channel across the barrier plate 160 within the interior volume of the enclosure 104. As illustrated, the bent tab 164 is positioned generally towards a right side of the upper barrier plate 160 (from the perspective of FIG. 3). However, the bent tab 164 may be disposed at a variety of positions along the upper barrier plate 160. The breakaway tabs 168 are configured to be snapped off of, or bent relative to, the upper barrier plate 160 and contribute to the general adjustability of the barrier assembly 100 by allowing users to provide customizable openings between compartments on opposing sides of the barrier plate 160. The elongated mounting holes 172 provide vertical adjustability of the upper barrier plate 160 such that a variety of enclosures having a variety of heights can be accommodated. The horizontal flange 176 includes engagement features 180 that are configured as recesses that extend through the horizontal flange 176. In other embodiments, similarly disposed engagement features on a barrier plate may be configured as, for example, recesses with different configurations or protrusions.

Figure 4:
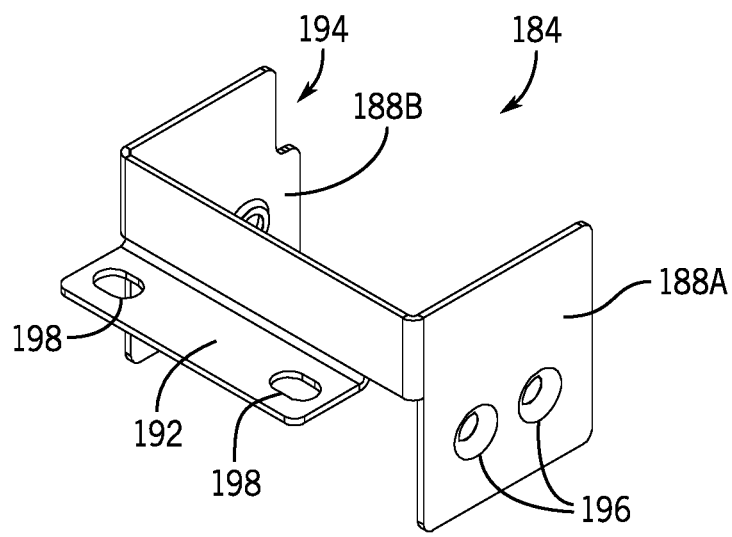
FIG. 4 is an isometric view of a bottom support bracket of the adjustable barrier assembly of FIG. 1 according to one embodiment of the invention.

FIG. 4 illustrates a bottom support bracket 184 according to one embodiment of the invention. The bottom support bracket 184 includes a first support arm 188A, a second support arm 188B, and a base flange 192 that extends therebetween. As illustrated, the base flange 192 is vertically offset from mounting portions of each of the first and second support arms 188A, 188B. The second support arm 188B includes a notch 194 that facilitates the adjustability of the barrier assembly 100. In particular, the notch 194 in the second support arm 188B allows for the bottom support bracket 184 to be installed in multiple configurations depending on whether the enclosure 104 is floor mounted or free standing, as will be further described with reference to FIG. 11. The support portions of each of the support arms 188 include mounting holes 196 and the base flange 192 includes mounting holes 198.

In some embodiments, as further discussed below with regard to the bottom support bracket 184, a support bracket can be reversible—i.e., can be installed in different orientations that are 180° (or otherwise) rotated relative to each other. In some cases, a reversible bracket may be fully symmetrical. In some cases, a reversible bracket may be symmetrical in some respects but not in others. For example, the support bracket 184 is generally symmetrical, but not entirely so: not only does the support arm 188B include the notch 194, but the base flange 192 and the mounting holes 198 collectively are disposed laterally closer to the support arm 188B than to the support arm 188A. In some cases, this can allow the support bracket 184 to accommodate distinct enclosure configurations depending on which reversible orientation is used for a particular installation.

Figure 5:
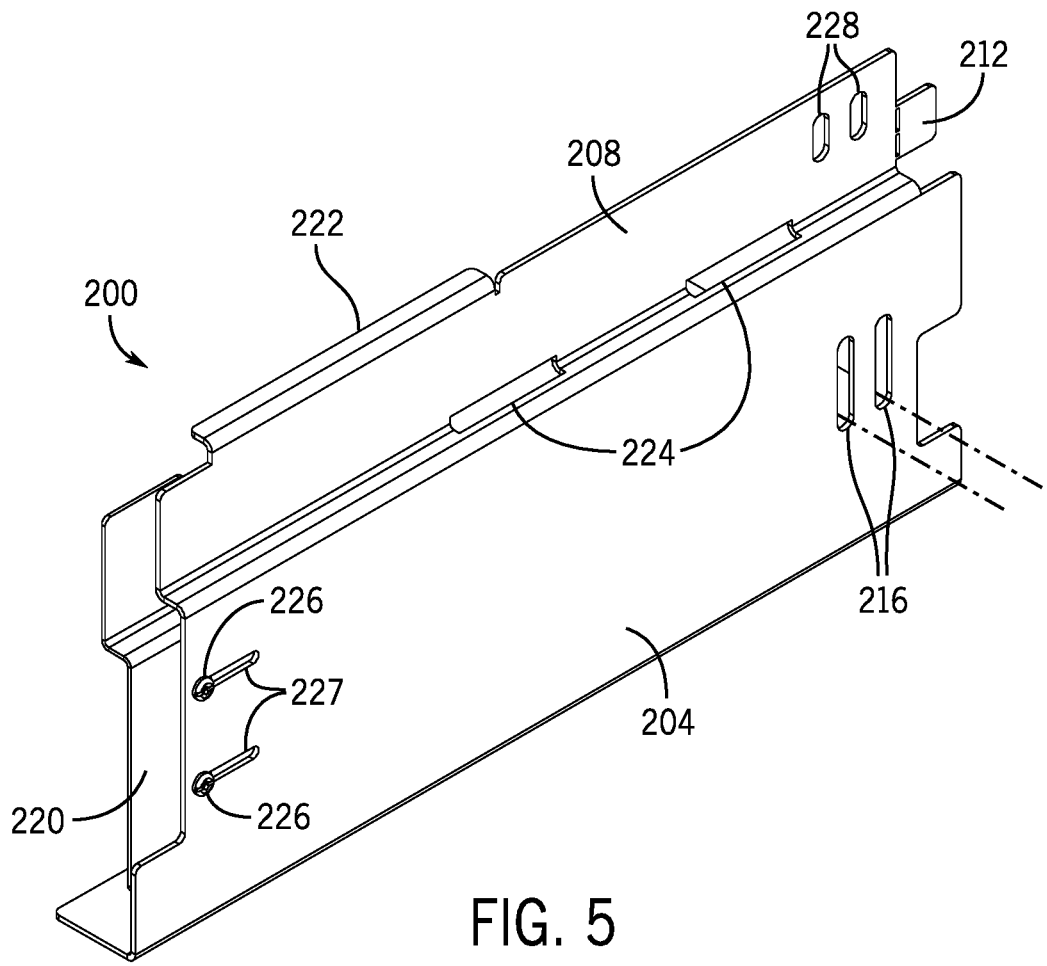
FIG. 5 is an isometric view of a lower barrier plate of the adjustable barrier assembly of FIG. 1 according to one embodiment of the invention.

Referring now to FIG. 5, a lower barrier plate 200 according to one embodiment of the invention is illustrated. The lower barrier plate 200 includes a main body 204, an upstanding wall 208, a breakaway tab 212, vertically extending elongated mounting holes 216 disposed within the main body 204, and a slidable panel 220. The upstanding wall 208 extends vertically from the main body 204, offset out of a plane of the main body 204, and includes a top flange 222 that is configured to provide support to the barrier panel assembly 124 during installation. The lower barrier plate 200 further includes elongated mounting holes configured as horizontal slots 224 at the base of the upstanding wall 208, which are configured to engage the barrier panel assembly 124, as further described with respect to FIG. 14. And the upstanding wall 208 includes elongated mounting holes 228 configured as vertical slots. In the illustrated embodiment, the mounting holes 228 are aligned vertically above the elongated mounting holes 216, although other configurations are possible. The breakaway tabs 212, similar to the breakaway tabs 168 of the upper barrier plate 160, are configured to be snapped off of, or bent relative to, the lower barrier plate 200 to contribute to the general adjustability of the barrier assembly 100 by allowing customizable openings.

The slidable panel 220 of the lower barrier plate 200 is slidable relative to the main body 204. In the illustrated example, the slidable panel 220 includes pins 226 that extend through horizontally oriented slots 227 disposed in the main body 204 which allow the slidable panel 220 to translate horizontally with respect to the main body 204. The slidable engagement of the main body 204 and the slidable panel 220 allow the lower barrier plate 200 to extend the full depth of a variety of enclosures having a variety of depths, to be adjusted to accommodate differently configured back panels of different enclosures, or to provide a customizable opening between two compartments of an enclosure. Although FIG. 5 illustrates the pins 226 of the slidable panel 220 engaging the horizontally oriented slots 227 of the main body 204, other configurations are possible. For example, some main bodies may include pins that are configured to engage slots disposed in a slidable panel.

Figure 6:
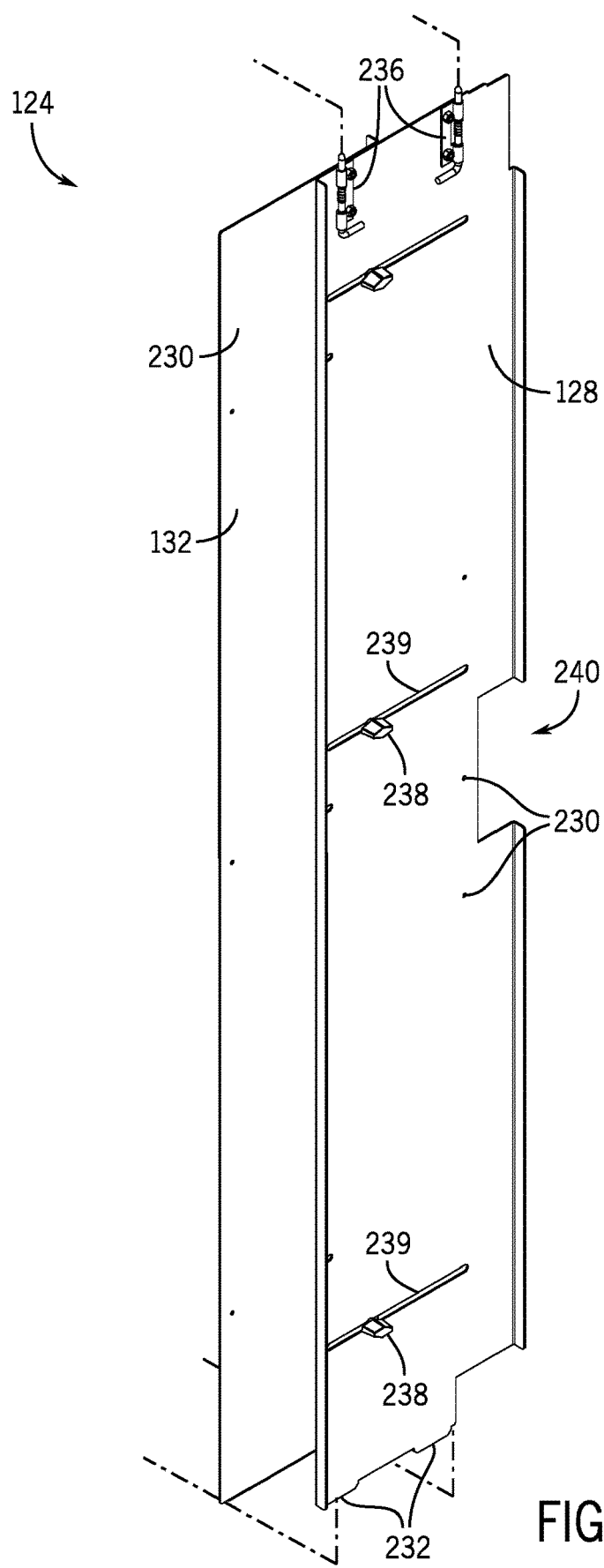
FIG. 6 is an isometric view of a barrier panel assembly of the adjustable barrier assembly of FIG. 1 according to one embodiment of the invention.

FIG. 6 illustrates the barrier panel assembly 124 according to one embodiment of the invention. As briefly described above, the barrier panel assembly 124 includes the second barrier panel 132 that is slidable relative to the first barrier panel 128. In the illustrated embodiment, the second barrier panel 132 includes pins 238 that extend through horizontally oriented slots 239 disposed in the first barrier panel 128 which allow the second barrier panel 132 to translate horizontally with respect to the first barrier panel 128. As shown, the pins 238 extend beyond a front surface of the first barrier panel 128 and include enlarged adjustable end caps. Accordingly, a user can easily engage the pins 238 to release the second barrier panel 132 to be moved relative to the first barrier panel 128 to set a width of the barrier panel assembly 124 and to secure the second barrier panel 128 at the selected width. For example, in some cases, the end caps can be threadably adjustable to lock or unlock relative slidable movement of the barrier panels 128, 132.

Although FIG. 6 illustrates the pins 238 of the second barrier panel 132 engaging the horizontally oriented slots 239 of the first barrier panel 128, other configurations are possible. For example, the first barrier panel 128 may include pins that are configured to engage slots disposed in the second barrier panel 132. In the illustrated embodiment, each of the first barrier panel 128 and the second barrier panel 132 further include mounting holes 230 configured to engage additional support components described with reference to FIGS. 7 and 8.

The barrier panel assembly 124 further includes engagement tabs 232 formed at the bottom of the first barrier panel 128 and engagement pins 236 disposed at the top of the first barrier panel 128. In the illustrated example, the engagement pins 236 are configured as spring-loaded pins configured to engage the engagement features 180 of the upper barrier plate 160. In other examples, the engagement pins 236 may be configured as bolts, rivets, clips, etc. that are configured to engage the upper barrier plate 160. Additionally, in other embodiments, the engagement tabs 232 may also be configured as spring-loaded pins that can be secured into the slots 224 of the lower barrier plate 200.

In some embodiments, cutouts may be provided in a barrier panel in order to accommodate particular features of a particular enclosure. For example, the barrier panel assembly 124 further includes a notch 240 disposed in the first barrier panel 128. In use, the notch 240 is dimensioned to accommodate a variety of latches used on a variety of enclosures when the barrier assembly 100 is installed.

Figure 7:
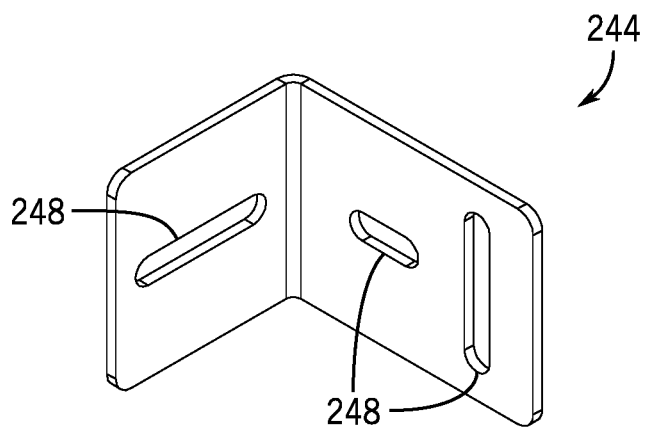
FIG. 7 is an isometric view of an L-bracket for use with the barrier panel assembly of FIG. 6 according to one embodiment of the invention.

Referring now to FIG. 7, an L-bracket 244 according to an embodiment of the invention is illustrated. As shown, the L-bracket 244 includes multiple elongated mounting holes 248, each perpendicular to the other in at least one direction. The L-bracket 244 is configured to provide additional support to the barrier panel assembly 124 once the barrier panel assembly 124 is installed within the enclosure 104. As will be further described with reference to FIGS. 15 and 16, the L-bracket is configured to engage the rear portion 120 of the enclosure 104 and the second barrier panel 132 of the barrier panel assembly 124.

Figure 8:
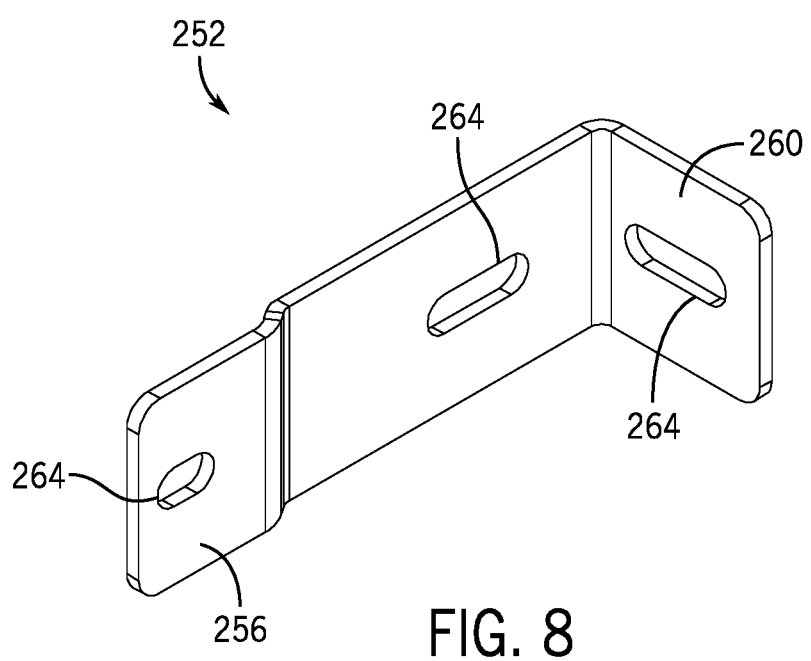
FIG. 8 is an isometric view of an inner support bracket for use with the barrier panel assembly of FIG. 6 according to one embodiment of the invention.

FIG. 8 illustrates an inner support bracket 252 according to an embodiment of the invention. As shown, the inner support bracket 252 includes a first flange 256 and a second flange 260, which is configured as an L-shaped flange. The inner support bracket 252 includes multiple elongated mounting holes 264, including elongated mounting holes 264 disposed in the first flange 256 and the second flange 260. The inner support bracket 252 is configured to provide additional support to the barrier panel assembly 124 once the barrier panel assembly 124 is installed within the enclosure 104. As will be further described with reference to FIG. 17, the inner support bracket 252 is configured to engage the front portion 116 of the enclosure 104 and the first barrier panel 128 of the barrier panel assembly 124.

Now that various components of the barrier assembly 100 have been described, methods of assembly according to multiple embodiments of the invention will be described with reference to FIGS. 9-17. Generally, the illustrated configurations of the components of the barrier assembly 100 can allow the barrier assembly 100 to be adjustably installed in enclosures of a variety of configurations, including free-standing or floor-mounted enclosure of various depths and heights, enclosures with removable or welded centerposts, and so on. In other embodiments, other components having common general configurations with those expressly discussed above can provide similar benefits.

Figure 9:
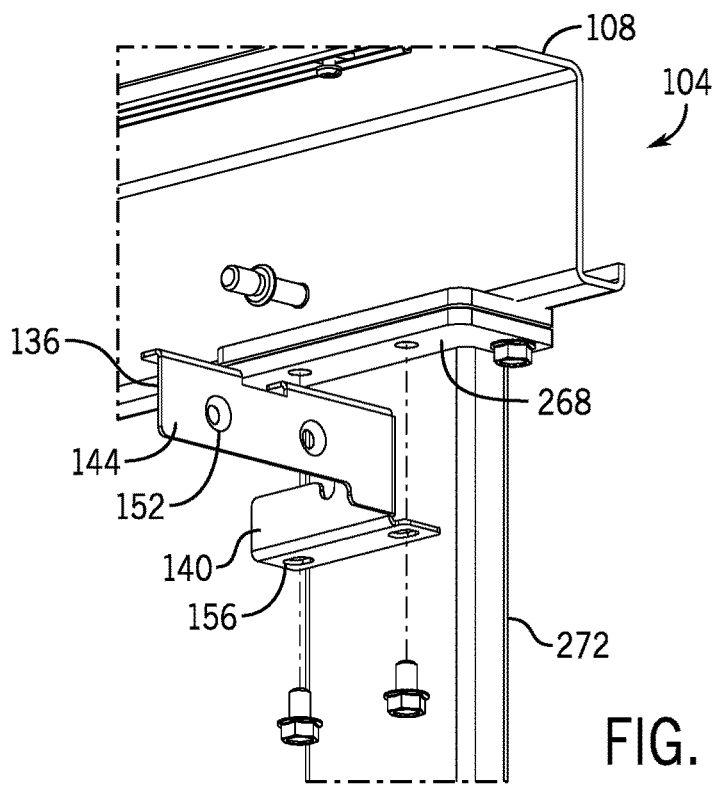
FIG. 9 is a partially exploded view of the enclosure of FIG. 1 with a removable centerpost and the top support bracket of FIG. 2 according to one embodiment of the invention.

With regard to the illustrated configuration of the barrier assembly 100, in particular, FIG. 9 illustrates the assembly of the top support bracket 136 to a top flange 268 of a removable centerpost 272 of an enclosure 104 according to one embodiment of the invention. As shown, the mounting holes 156 of the base arm 140 are configured to align with mounting holes of the top flange 268 of the removable centerpost 272. Fasteners are then used to secure the top support bracket 136 to the enclosure 104 at to the top portion 108 of the enclosure 104 and, in particular, at the top end of the centerpost 272. As briefly described above, the base arm 140 is vertically offset from the support arm 144 such that the support arm 144 extends to dispose the mounting holes 152 above the removable centerpost 272 (see, for example, FIG. 10).

Figure 10:
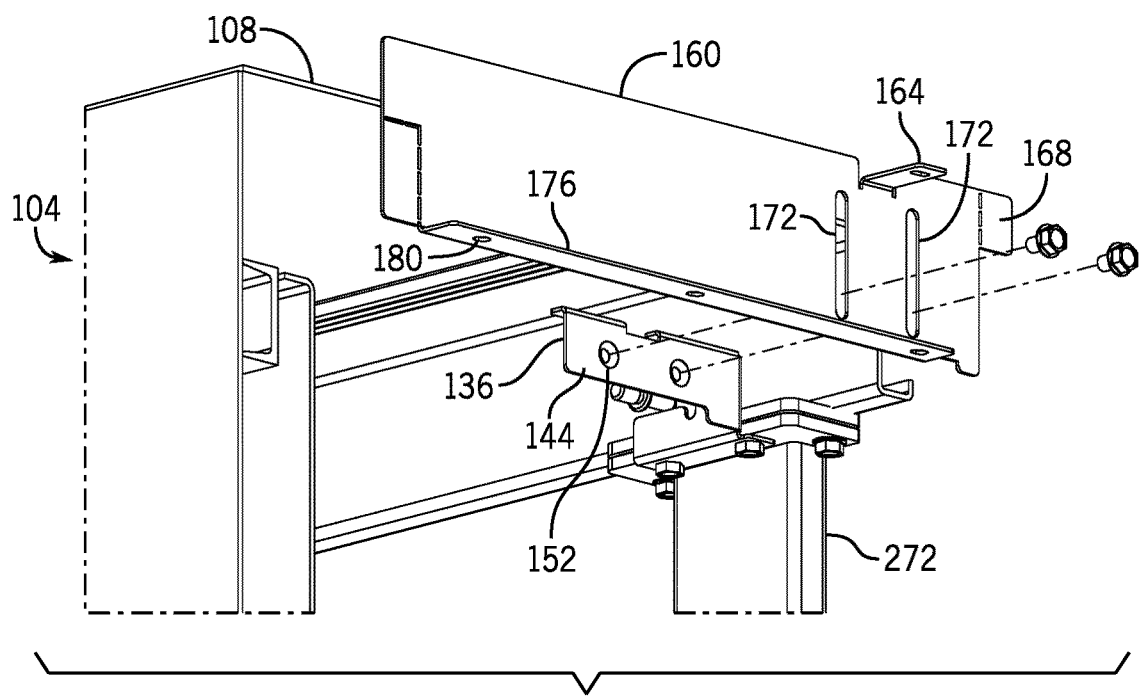
FIG. 10 is a partially exploded view of the enclosure of FIG. 1, the upper barrier plate of FIG. 3, and the top support bracket of FIG. 2 according to one embodiment of the invention.

As illustrated in FIG. 10, once the top support bracket 136 is installed, the upper barrier plate 160 is secured to the top support bracket 136 via fasteners. As shown, the fasteners extend through the elongated mounting holes 172 of the upper barrier plate 160 and the mounting holes 152 of the support arm 144 of the top support bracket 136. The elongated mounting holes 172 allow the upper barrier plate 160 to be adjusted vertically such that the upper barrier plate 160 can be installed adjacent to the top portion 108 of the enclosure 104. In general, the elongated mounting holes 172 provide accommodation for a variety of enclosures having a variety of heights. In some embodiments, the upper barrier plate 160 can be installed onto the top support bracket 136 before the top support bracket 136 is installed within an enclosure, and can be vertically adjusted before or after installation.

As briefly discussed above, the bent tab 164 is configured to provide a channel across the barrier assembly 100 within the interior volume of the enclosure 104. In some embodiments, the bent tab 164 provides clearance for a rail (e.g., a lighting rail) located within the enclosure 104. In some embodiments, a spring nut may be inserted into a rail in alignment with the bent tab 164, to add an additional anchor point for the upper barrier plate 160.

Figure 11:
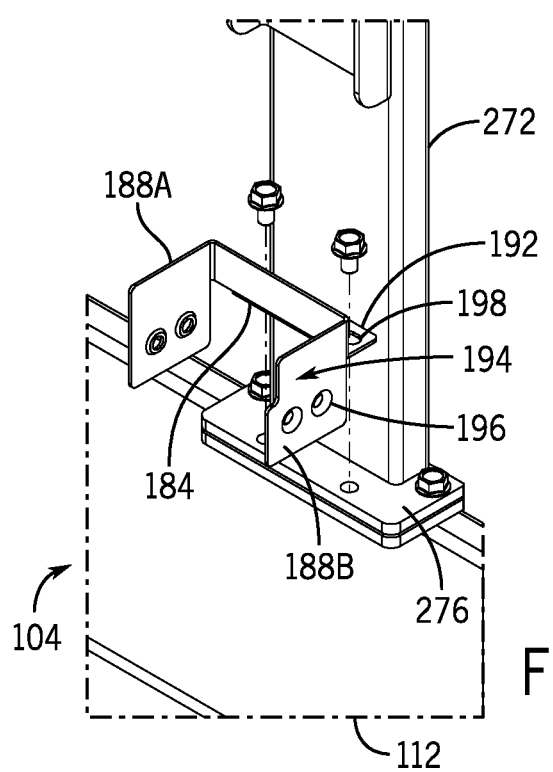
FIG. 11 is partially exploded view of the free-standing enclosure of FIG. 1 with the bottom support bracket of FIG. 4 according to one embodiment of the invention.

FIG. 11 illustrates the assembly of the bottom support bracket 184 to a bottom flange 276 of the removable centerpost 272 of the enclosure 104 according to one embodiment of the invention. As discussed above and shown in FIG. 11, for example, the enclosure 104 is configured as a free standing enclosure. Correspondingly, the reversible bottom support bracket 184 can be installed in a first orientation as shown. In particular, in the illustrated orientation, the mounting holes 198 of the base flange 192 are configured to align with mounting holes of the bottom flange 276 of the removable centerpost 272. Fasteners are then used to secure the bottom support bracket 184 to the enclosure 104 at the bottom portion 112 of the enclosure 104. As shown, the support arm 188B is oriented to engage the lower barrier plate 200. As briefly described above, the base flange 192 is vertically offset from the mounting holes 196 of the support arms 188A and 188B such that the support arms 188A and 188B extend to dispose the mounting holes 196 above the removable centerpost 272.

Figure 11A:
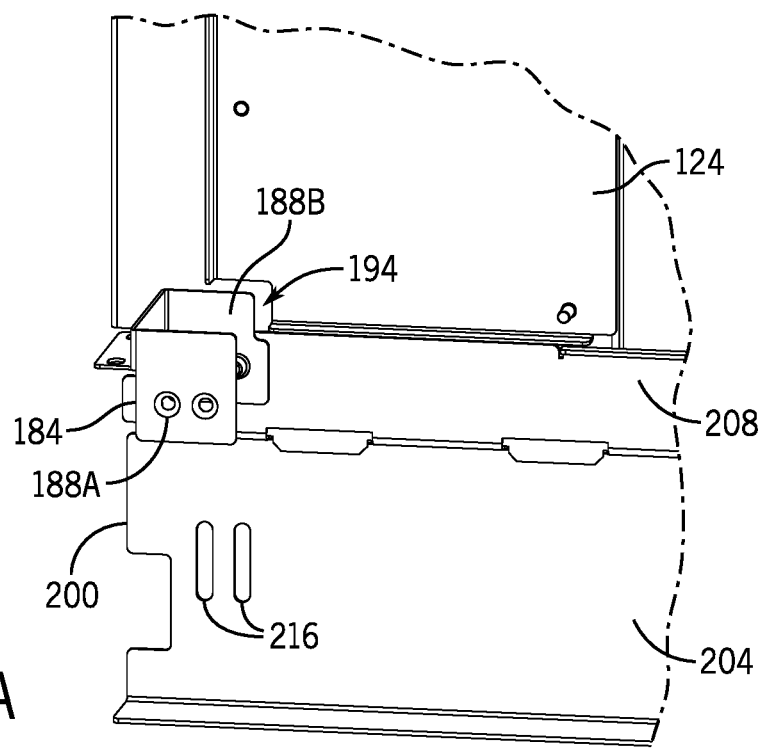
FIG. 11A is a partial view of the enclosure of FIG. 11, including the bottom support bracket of FIG. 4 and the barrier panel assembly of FIG. 6 in a retracted position according to one embodiment of the invention.

As illustrated in FIG. 11A, the lower barrier plate 200 is then secured to the bottom support bracket 184 via fasteners. As shown, the fasteners extend through the mounting holes 228 within the upstanding wall 208 of the lower barrier plate. Such configuration can also be used in some cases to engage the lower barrier plate 200 at the mounting holes 216, depending on the particular height of the lower portion of an enclosure and other geometric considerations. In general, each of the elongated mounting holes 216 and the mounting holes 228 in the upstanding wall 208 of the lower barrier plate 200 facilitate the vertical adjustability of the lower barrier plate 200, and therefore, the barrier assembly 100, by providing a variety of securement points to engage the lower barrier plate 200 with the bottom support bracket 184.

As briefly described above with reference to the bottom support bracket 184, and as illustrated in FIG. 11A, the notch 194 in the second support arm 188B can allow the second barrier panel 132 (see also FIG. 6) of the barrier panel assembly 124 to fully retract behind the first barrier panel 128 without causing interference. In particular, in the illustrated embodiment, the notch 194 provides clearance for a flange at the lower edge of the panel 132, although other configurations are also possible.

Further, the slidable panel 220 provides accommodation for a variety of enclosures having a variety of depths, by allowing the lower barrier plate 200 to extend between the front portion 116 and the rear portion 120 of the enclosure 104. In some embodiments, the slidable panel 220 can be adjusted to accommodate a back panel of an enclosure (not shown in FIG. 11), which may in some configurations extend below the top edge of the lower barrier plate 200, including when the barrier plate 200 is aligned to extend substantially fully to the floor of the enclosure. In some embodiments, a bendable tab or cutout can provide similar accommodation, although bendable tabs may not be suitable for some embodiments that exhibit multi-planar geometry, such as shown for the barrier plate 200 (i.e., relative to the main body 204 and the upstanding wall 208).

Figure 12:
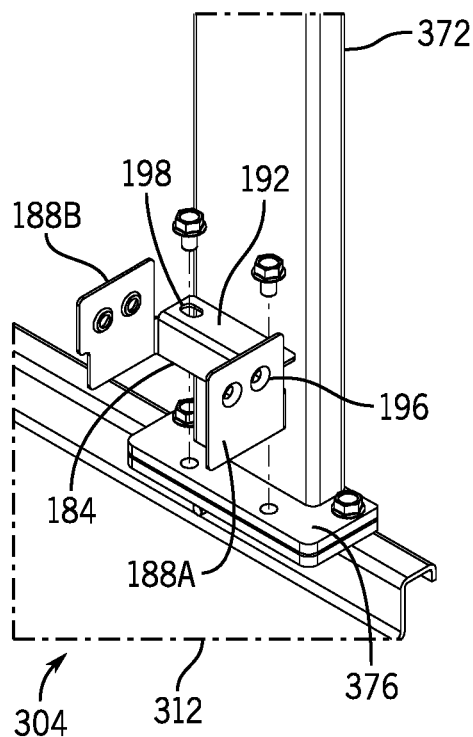
FIG. 12 is a partially exploded view of a floor-mounted enclosure with a removable centerpost and the bottom support bracket of FIG. 4 according to one embodiment of the invention.
Figure 13:
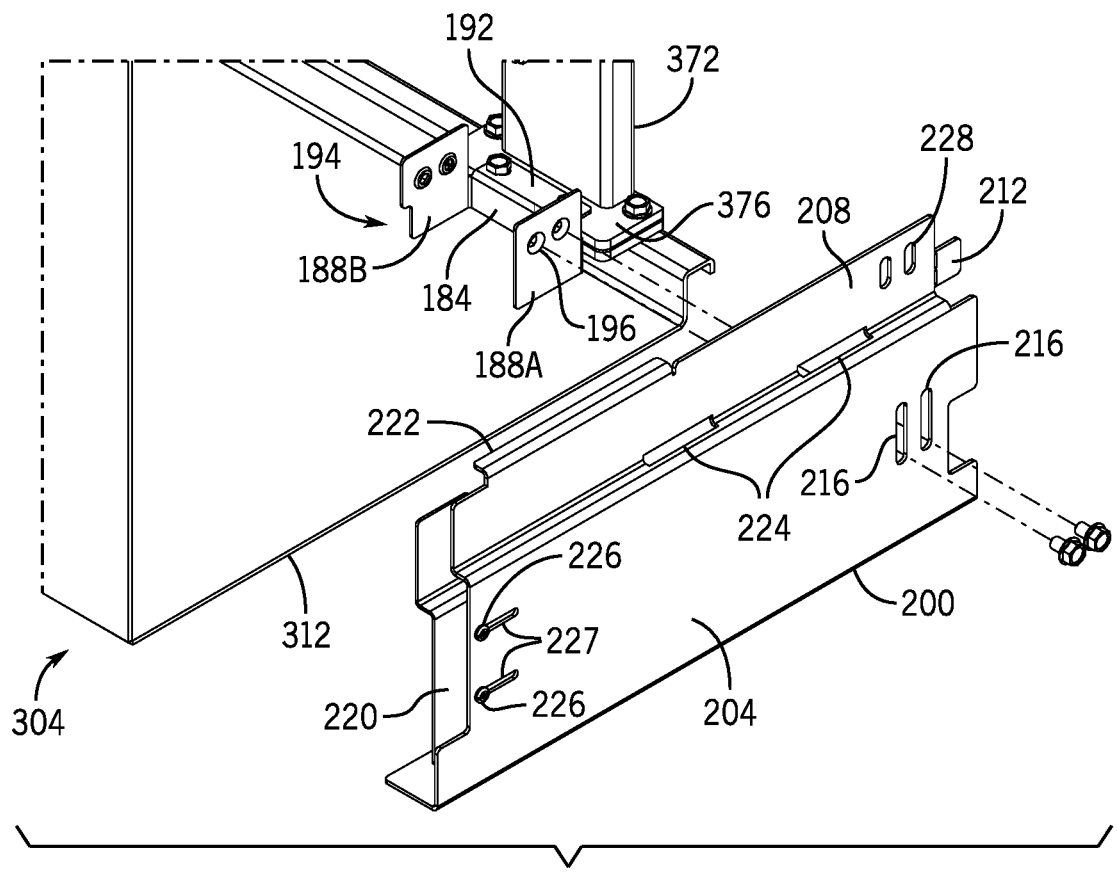
FIG. 13 is a partially exploded view of the enclosure of FIG. 12, including the lower barrier plate of FIG. 5 and the bottom support bracket of FIG. 4 according to one embodiment of the invention.

In other embodiments, an enclosure 304 may be configured as a floor-mounted enclosure, as shown in FIGS. 12 and 13. Similar to the enclosure 104, the enclosure 304 includes a centerpost 372 that has a bottom flange 376. Correspondingly, the bottom support bracket 184 may sometimes be oriented in a reversed orientation such that an opposite side of the base flange 192 engages the bottom flange 376 of the removable centerpost 372 as compared to the side of the base flange 192 that engages the bottom flange 276 of the removable centerpost 272 as illustrated in FIGS. 11 and 11A. The reversible bottom support bracket 184 can be installed in a second orientation as shown. In particular, the mounting holes 198 of the base flange 192 are configured to align with mounting holes of the bottom flange 376 of the removable centerpost 372. Fasteners are then used to secure the bottom support bracket 184 to the enclosure 304 at a bottom portion 312 of the enclosure 304.

Figure 14:
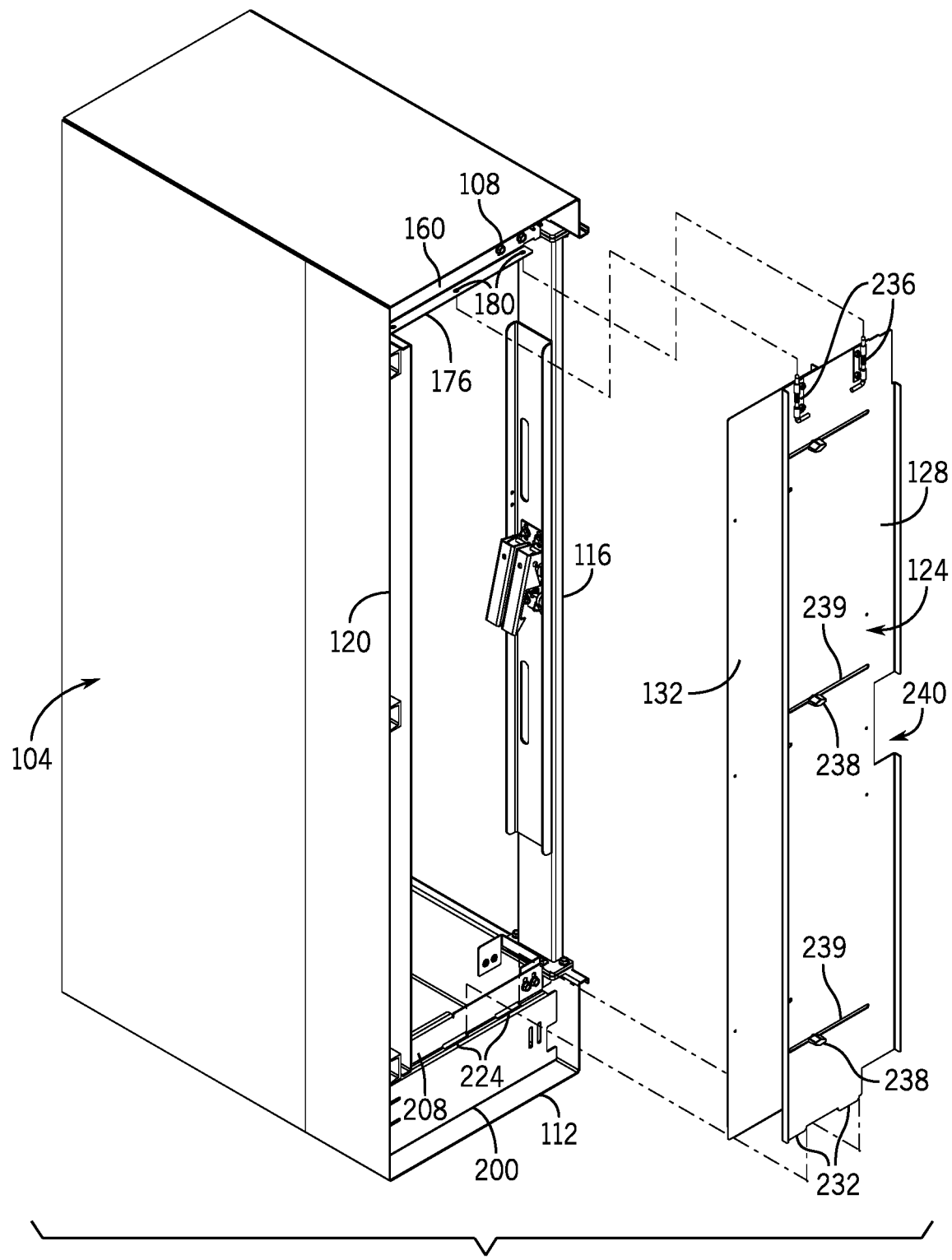
FIG. 14 is a partially exploded partial view of the barrier panel assembly and the enclosure of FIG. 1 according to one embodiment of the invention.

During an installation process, similar to the process as described above in references to FIGS. 11 and 11A, the lower barrier plate 200 can be secured to the bottom support bracket 184 at the support arm 188A via fasteners. As shown, the fasteners extend through the elongated lower mounting holes 216 of the lower barrier plate 200 and the mounting holes 196 of the first support arm 188A of the bottom support bracket 184. The elongated mounting holes 216 allow the lower barrier plate 200 to be adjusted vertically such that the lower barrier plate 200 can be installed adjacent to the bottom portion 312 of the enclosure 304. Further, use of the mounting holes 216 in general can allow the barrier plate 200 to accommodate the relatively shallow bottom portion 312 of the enclosure 304, although, in general, the elongated mounting holes 216 can accommodate a variety of enclosures having a variety of heights. As similarly noted above, such a configuration can also be used in some cases to engage the lower barrier plate 200 at the mounting holes 228, depending on the particular height of the lower portion of an enclosure and other geometric considerations Referring back to the enclosure 104, in general following the installment of the upper barrier plate 160 and the lower barrier plate 200 to the enclosure 104 (or enclosure 204), the barrier panel assembly 124 may be installed within the enclosure 104, as illustrated in FIG. 14 according to one embodiment of the invention. As the barrier panel assembly 124 is moved toward the enclosure 104, the engagement tabs 232 may come into contact with the upstanding wall 208 of the lower barrier plate 200 to guide the engagement tabs 232 toward the slots 224 at the base of the upstanding wall 208, although some in installations the tabs 232 can be inserted directly into the slots 224. During installation, once the engagement tabs 232 are inserted into the slots 224 of the lower barrier plate 200, the barrier panel assembly 124 may be pivoted at the engagement tabs 232 to move the engagement pins 236 towards the upper barrier plate 160. The engagement pins 236 are then inserted into the engagement features 180 of the horizontal flange 176 of the upper barrier plate 160, thereby at least partially securing the barrier panel assembly 124 within the enclosure 104. In this regard, the use of spring-biased pins, such as the engagement pins 236 can allow relatively easy installation of the barrier assembly 100, as well as relatively easy disassembly. However, other features can be used, including other engagement features on a top or bottom barrier plate or on a main barrier panel assembly extending therebetween.

In general, height of the barrier assembly 100 can be adjusted via the combined adjustability of the top support bracket 136, the upper barrier plate 160, the bottom support bracket 184, and the lower barrier plate 200. In contrast, the width of the barrier assembly 100 (i.e., the extension of the barrier assembly 100 based on the depth of the enclosure 104) is adjusted primarily via the barrier panel assembly 124, as relates to the depth of a middle (e.g., main) portion of the enclosure 104. Additional adjustments of the barrier assembly 100 can be made at each of the upper barrier plate 160 and the lower barrier plate 200 via breakaways tabs 168, 212. In some cases, the breakaway tabs 168, 212 can be used to provide additional pass-through openings for other components, including interlock mechanisms, to pass across the barrier assembly 100.

During installation, before or after the barrier panel assembly 124 has been partially secured within the enclosure 104 between the upper barrier plate 160 and the lower barrier plate 200, the second barrier panel 132 may be slid horizontally such that the barrier panel assembly 124 extends substantially fully between the front portion 116 and the rear portion 120 of the enclosure 104. In some cases, the barrier panel assembly 124 can accordingly extend substantially fully between a front wall of an enclosure and a rear wall of the enclosure, or between a front wall of an enclosure and a rear panel of the enclosure (as shown in FIG. 14). In one embodiment, the second barrier panel 132 is configured to slide along the top flange 222 of the upstanding wall 208. As briefly discussed above, the top flange 222 of the upstanding wall 208 can accordingly provide support for the second barrier panel 132 to facilitate horizontal movement of the second barrier panel 132 and prevent binding between the pins 238 of the second barrier panel 132 and the horizontally oriented slots of the first barrier panel 128.

Figure 15:
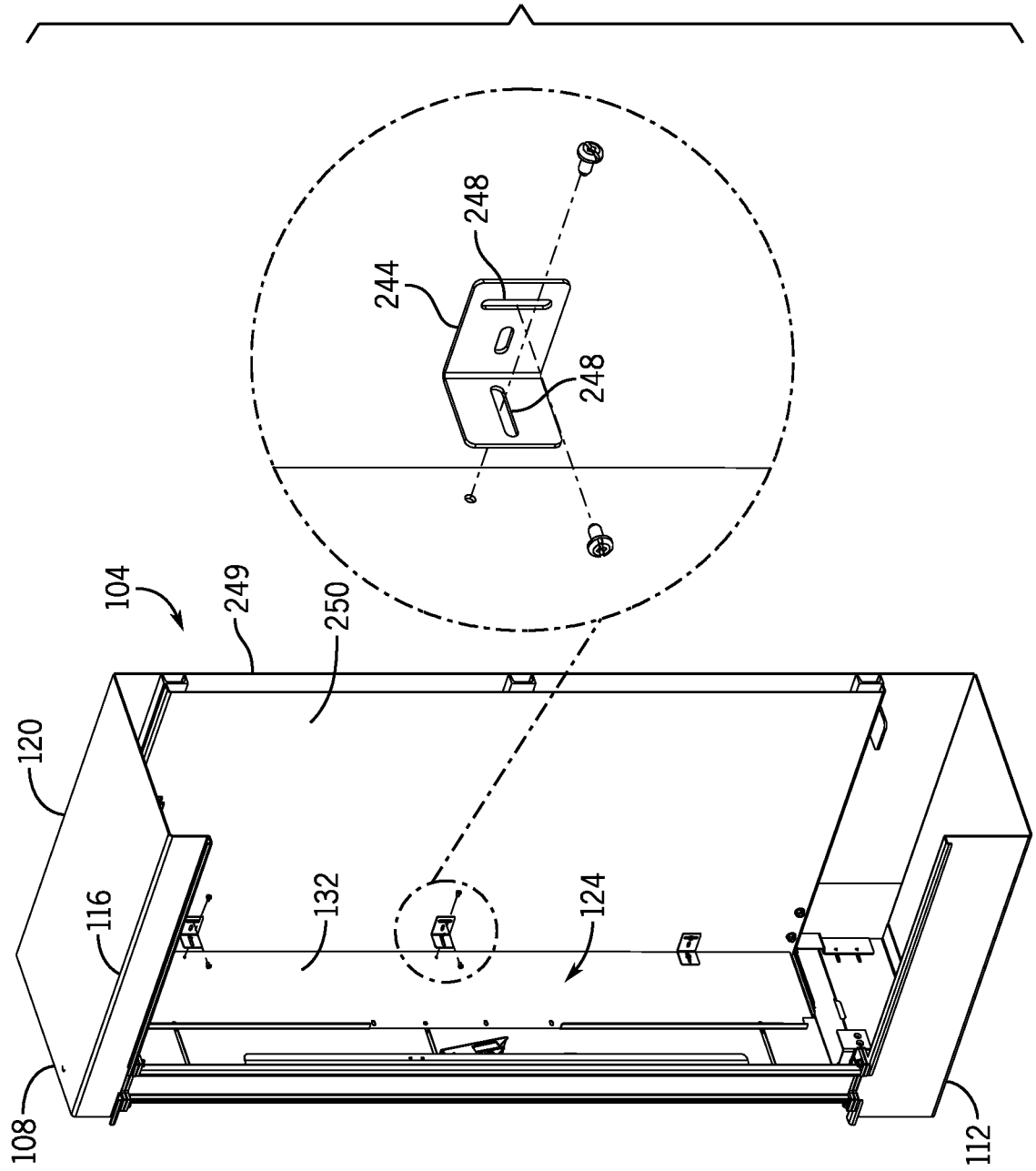
FIG. 15 is another partial view of the barrier panel assembly and the enclosure of FIG. 1, including a detailed partially exploded view of the L-bracket of FIG. 7 and the barrier panel assembly, with the enclosure equipped with a single back panel according to one embodiment of the invention.
Figure 16:
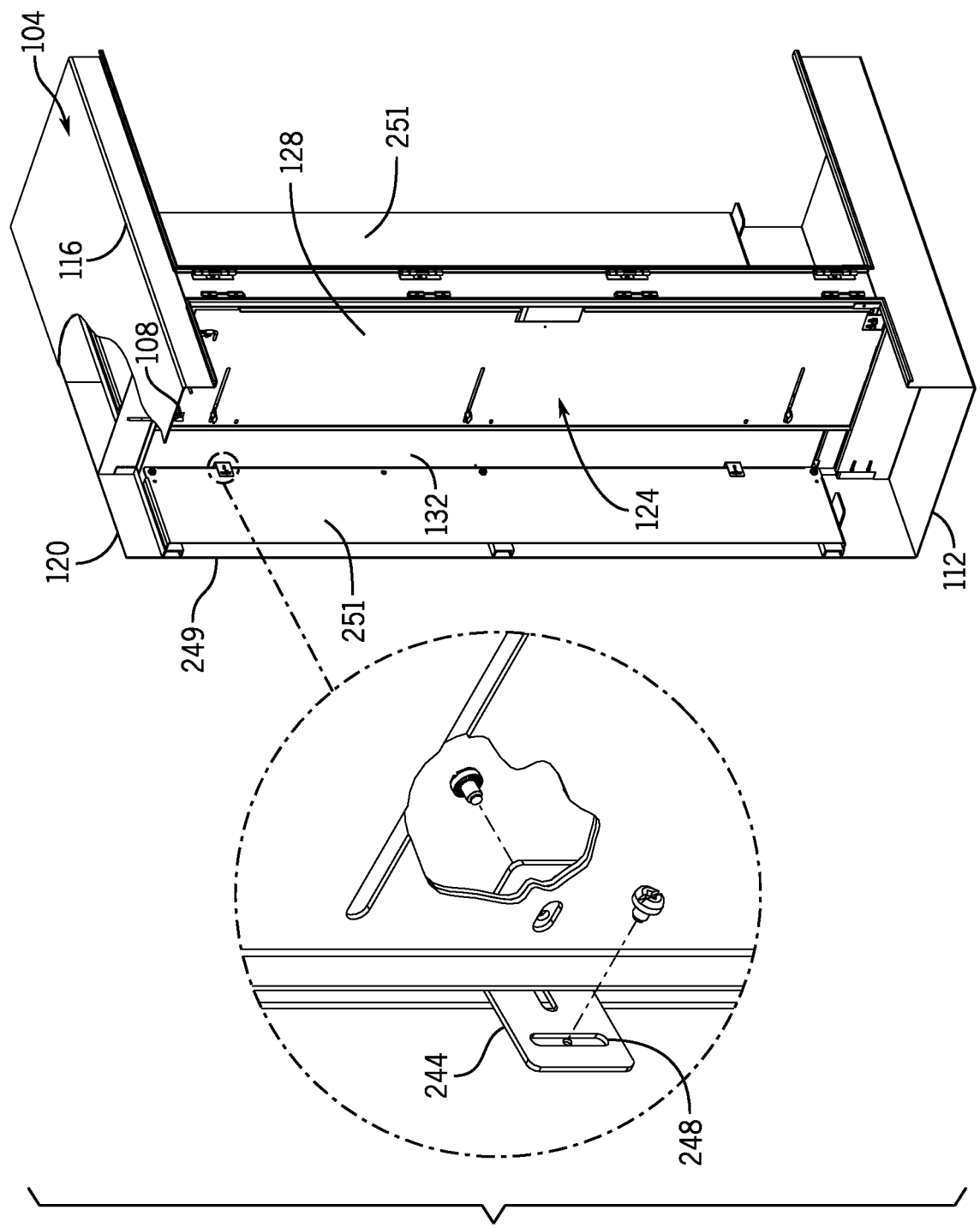
FIG. 16 is a partially exploded partial view of the barrier panel assembly and the enclosure of FIG. 1, including a detailed view of the L-bracket of FIG. 7 and the barrier panel assembly, with the enclosure equipped with a divided back panel according to one embodiment of the invention.

Referring now to FIG. 15, an anchor bracket, such as the L-bracket 244, for example, may be used to further secure the barrier panel assembly 124 within the enclosure 104. In particular, the L-bracket 244 is configured to engage the second barrier panel 132 such that a fastener may extend through one or more elongated mounting holes 248 of the L-bracket 244 and one or more of the mounting holes 230 of the second barrier panel 132. Further, the L-bracket 244 is configured to engage a feature of the rear portion 120 of the enclosure 104 (e.g., at a rear panel 249 of the enclosure 104) such that a fastener can extend through one or more elongated mounting holes 248 and the rear portion feature. In the example shown in FIG. 15, the rear panel 249 of the enclosure 104 includes a single panel 250. As a result, a corner of the L-bracket 244 faces generally away from the interior of the enclosure 104. In some embodiments, a plurality of L-brackets 244 are disposed along the barrier panel assembly 124 between the top portion 108 of the enclosure 104 and the bottom portion 112 of the enclosure 104. In other embodiments, as shown in FIG. 16, the rear panel 249 of the enclosure 104 includes a divided panel 251. As a result, a corner of the L-bracket 244 faces generally towards the interior of the enclosure 104.

Figure 17:
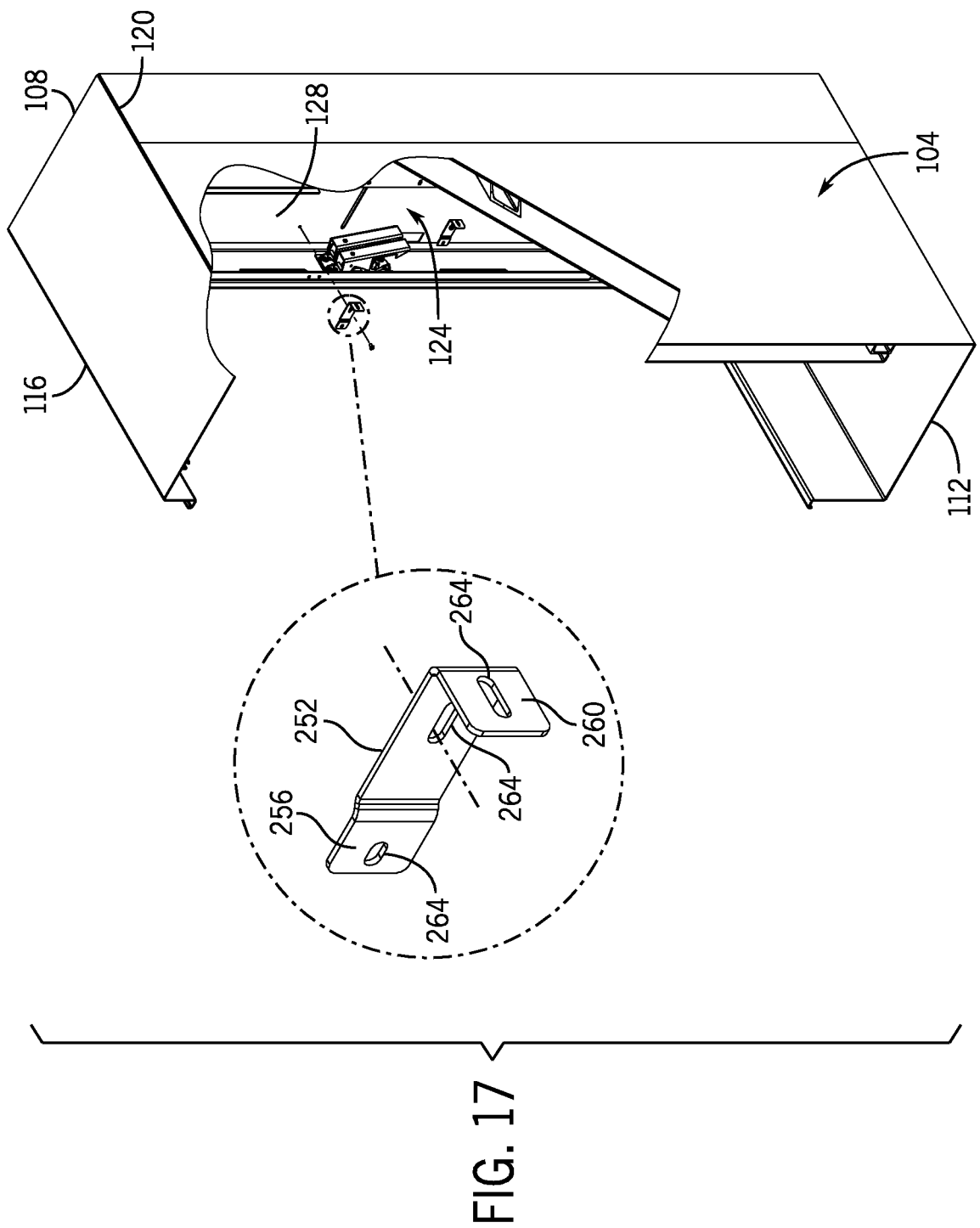
FIG. 17 is a partially exploded partial view of the barrier panel assembly and the enclosure of FIG. 1, including a detailed view of the inner support bracket of FIG. 8, according to one embodiment of the invention.

Referring now to FIG. 17, the inner support bracket 252 may be used to further secure the barrier panel assembly 124 within the enclosure 104. In particular, the inner support bracket 252 is configured to engage the first barrier panel 128 such that a fastener may extend through one of the elongated mounting holes 264 of the inner support bracket 252 and one or more of the mounting holes 230 of the first barrier panel 128. Further, the inner support bracket 252 is configured to engage the front portion 116 of the enclosure 104. In particular, in a preferred embodiment, the first flange 256 of the inner support bracket 252 may clamp over the edge of the removable centerpost 272, thereby securing the barrier panel assembly 124 with in the enclosure 104. In other embodiments, the inner support bracket 252 can be configured to engage the removable centerpost 272 of the enclosure 104 such that a fastener may extend through one of the elongated mounting holes 264 of the inner support bracket 252 and a mounting hole of the removable centerpost 272.

In general, the previous description of the barrier assembly 100 for use in the enclosure 104 relates to an enclosure having a removable centerpost. However, in other embodiments, an enclosure may include a welded centerpost. In some embodiments, a welded centerpost does not include a top flange and a bottom flange similar to the top flange 268 and the bottom flange 276 of the removable centerpost 272 (see, for example, FIGS. 9-12). In some embodiments, as described below with reference to FIGS. 18-24, the barrier assembly 100 can nonetheless be used in an enclosure that has a welded centerpost.

Figure 18:
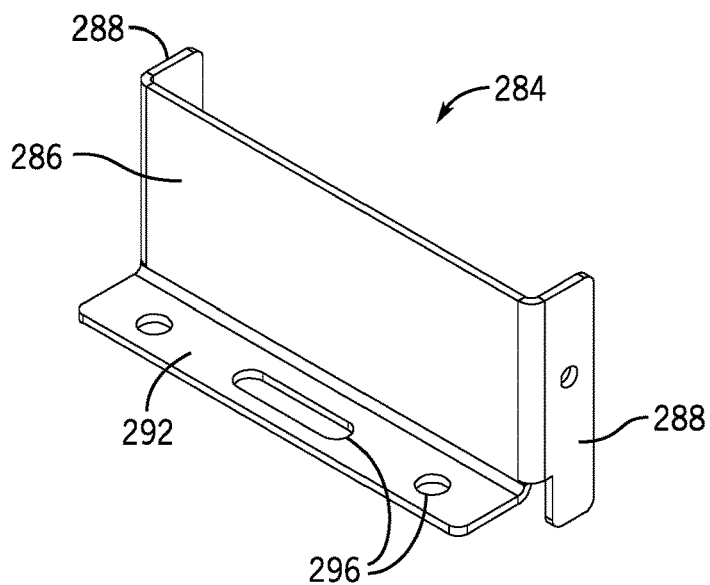
FIG. 18 is an isometric view of an anchor bracket of the adjustable barrier assembly according to one embodiment of the invention.

FIG. 18 illustrates an anchor bracket 284 according to one embodiment of the invention. The anchor bracket 284 includes a main body 286, lateral anchor flanges 288 on opposing lateral sides of the main body 286, and a support flange 292 extending from an edge of the main body 286 between the anchor flanges 288. The support flange 292 extends generally perpendicular to the lateral anchor flanges 288 and to the main body 286, and includes mounting holes 296. In some embodiments, one or more of the mounting holes 296 may be configured as elongated holes, as illustrated, for example, in FIG. 18. Elongated holes in the support flange 292 can further contribute to the general adjustability of the barrier assembly 100. In particular, as illustrated in FIG. 20, the mounting holes 296 allow the top support bracket 136 to be secured to the anchor bracket 284 at a plurality of positions.

Figure 19:
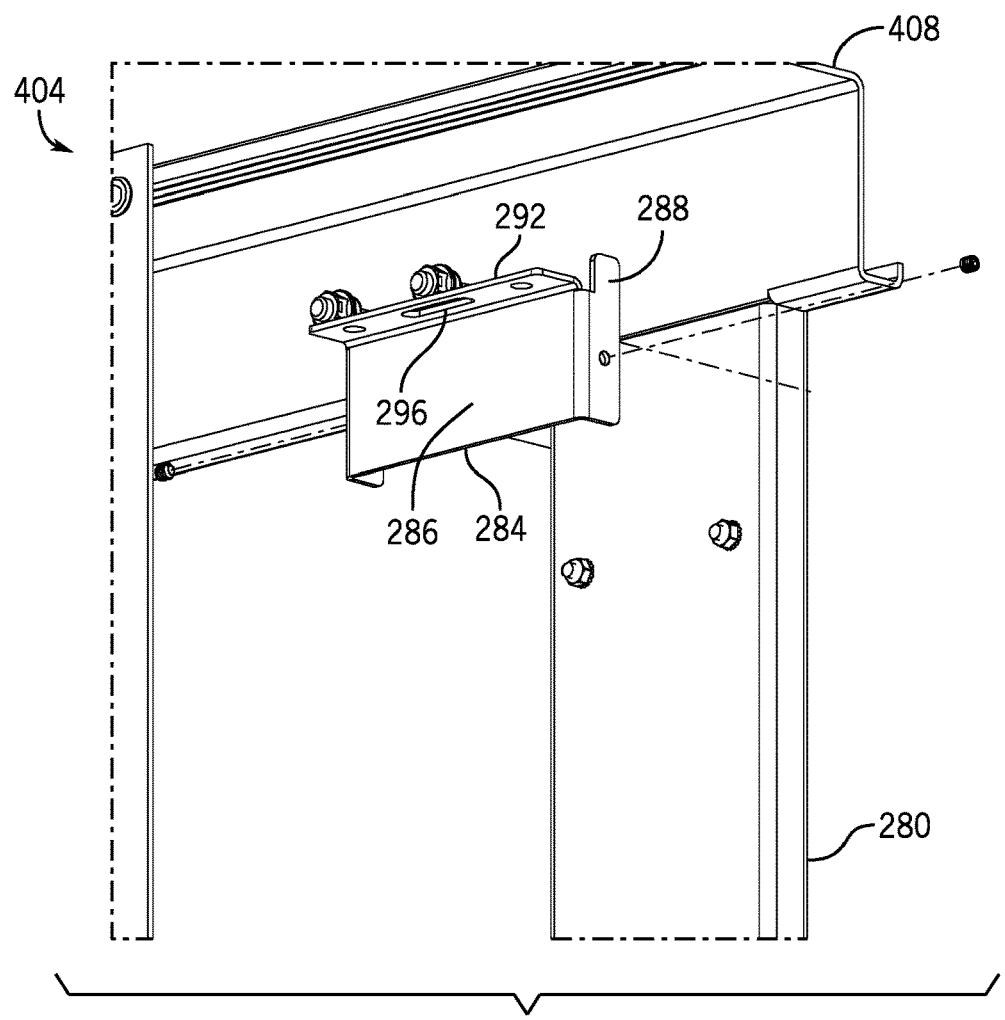
FIG. 19 is a partially exploded partial view of an enclosure equipped with a welded centerpost, including the anchor bracket of FIG. 18 adjacent to a top portion of the enclosure according to one embodiment of the invention.
Figure 20:
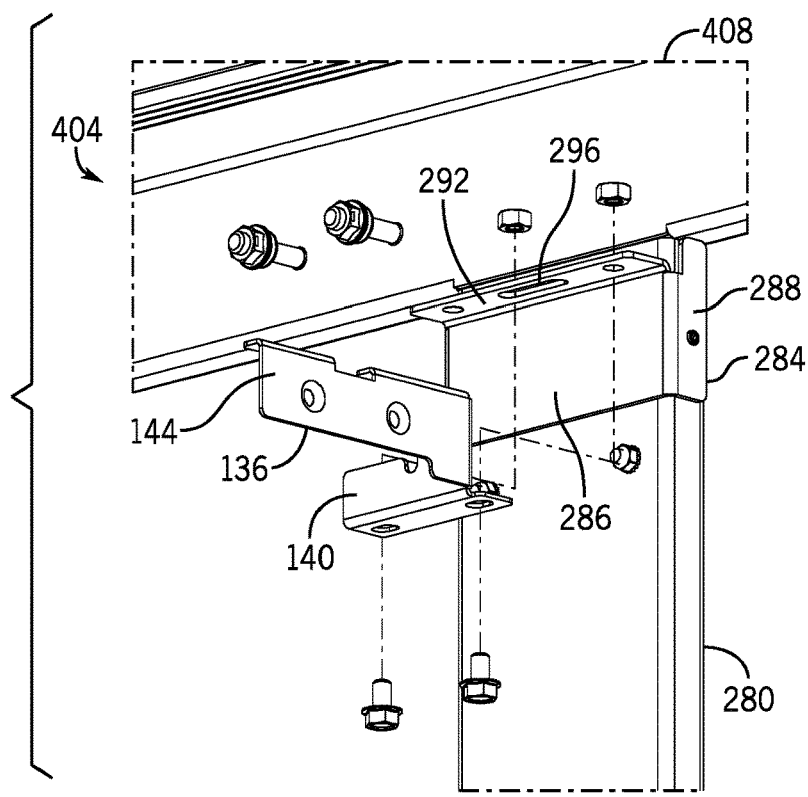
FIG. 20 is a partially exploded partial view of the enclosure of FIG. 19, further including the top support bracket of FIG. 2 according to one embodiment of the invention.

As illustrated in FIGS. 19 and 20, the lateral anchor flanges 288 of the anchor bracket 284 extend beyond the support flange 292. Accordingly, when the anchor bracket 284 is installed at the top portion 108 of an enclosure 404 that includes a welded centerpost 280, the lateral anchor flanges 288 contact a top portion 408 (e.g., at a top wall of a door opening of the enclosure 404) and thereby define a gap between the contact part of the top portion 408 and the support flange 292. The support flange 292 is thereby positioned appropriately to engage the base arm 140 of the top support bracket 136 such that the support arm 144, which is vertically offset from the base arm 140, extends above the welded centerpost 280 without interference. In general, since the lateral anchor flanges 288 extend beyond the support flange 292, installation of the anchor bracket 284 is streamlined since, during installation, a user can move the anchor bracket 284 up the welded centerpost 280 until the lateral anchor flanges 288 contact the surface proximate to the top portion 408 and the support flange 292 is positioned below the top portion 408 to engage the top support bracket 136.

Figure 21:
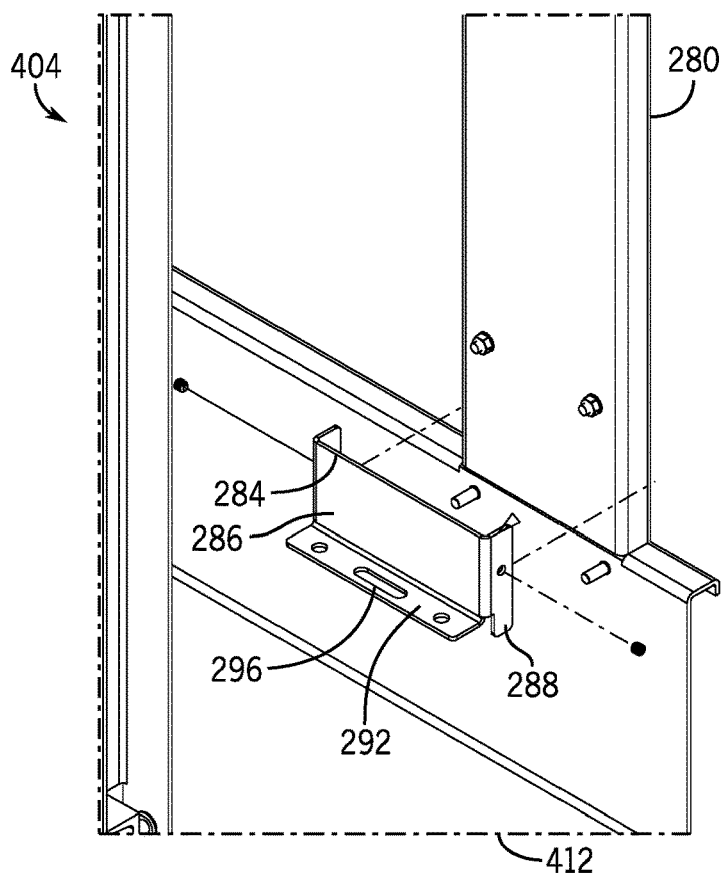
FIG. 21 is a partially exploded view of the enclosure of FIG. 19, further including the anchor bracket of FIG. 18 adjacent to a bottom portion of the enclosure according to one embodiment of the invention.

In some cases, an anchor bracket can be reversible, so as to be selectively installed at either a top or a bottom of a centerpost. Referring now to FIGS. 21 and 22, for example, the anchor bracket 284 can be secured to the welded centerpost 280 at a bottom portion 412 of the enclosure 404 similarly to the top portion 408 (e.g., with the anchor flanges 288 contacting a bottom wall of a door opening of the enclosure 404). In one embodiment, as shown in FIG. 22, the support flange 292 of the anchor bracket 284 is configured to engage the base flange 192 of the bottom support bracket 184. During installation, a fastener is inserted through the mounting holes 198 of the bottom support bracket 184 and the mounting holes 296 of the anchor bracket 284. In the illustrated embodiment, the support arm 188B of the bottom support bracket 184 is positioned to engage the lower barrier plate 200. However, other configurations are possible depending on various characteristics of the enclosure 404. For example, if the enclosure 404 is configured as a floor mounted enclosure, the bottom support bracket 184 may be secured to the anchor bracket 284 such that the support arm 188A is positioned to engage the lower barrier plate 200 (e.g., similar to the configuration shown in FIGS. 12 and 13).

During installation of the barrier assembly 100 to the enclosure 404 that has a welded centerpost 280, and once the base arm 140 of the top support bracket 136 is engaged with and secured to the support flange 292 of the anchor bracket 284, the remaining installation process can proceed generally similarly to that which was previously described with reference to FIGS. 9-16. As such, a detailed description for at least partially securing the barrier panel assembly 124 within the enclosure 404 will be omitted to avoid repetition. However, the installation of the inner support bracket 252 within the enclosure 404 that has the welded centerpost 280 can vary from that of an enclosure with a removable centerpost, including as described below.

Figure 24:
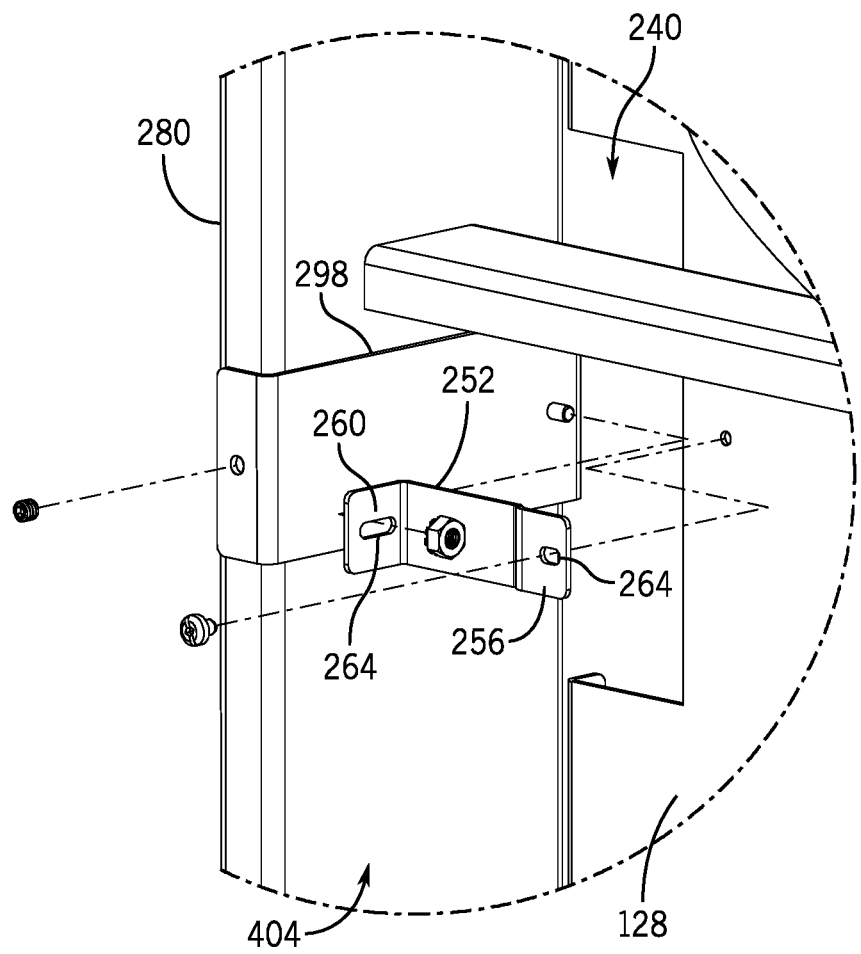
FIG. 24 is a partially exploded partial view of the enclosure of FIG. 19, the inner support anchor of FIG. 23, and the inner support bracket of FIG. 8 according to one embodiment of the invention.

FIG. 23 illustrates an inner support anchor 298 configured to engage the welded centerpost 280. As illustrated in FIG. 24, the inner support bracket 252 can engage and be secured to each of the first barrier panel 128 of the barrier panel assembly 124 and the inner support anchor 298. The inner support bracket 252 is secured similarly as described with reference to FIG. 17. In the example shown in FIG. 24, the second flange 260 of the inner support bracket 252 may engage the welded centerpost 280 and the first flange 256 may engage the first barrier panel 128 proximate to the notch 240.

In some embodiments, a barrier panel or barrier assembly, such as the barrier panel assembly 124 or barrier assembly 100, can be formed from non-conductive material (e.g., polymer composite material). In some embodiments, other materials can be used, including metallic or other materials, with or without coatings, such as powder-coat paints. In some embodiments, a combination of materials can be used (e.g., a combination of composite panels and metallic panels).

In general, due to the high degree of adjustability, barrier assemblies as disclosed herein, including the barrier assembly 100, can be used with a variety of different enclosure types and configurations, thereby significantly reducing the need for customers to purchase and stock many different types of barriers (or barrier components) for differently sized enclosures. As such, embodiments of the invention can allow for improved purchasing and inventory management for customers. For example, with conventional barriers, customers may need to purchase and stock a large number of different panels, or components of adjustable panel assemblies, in order to accommodate a large number of different enclosure dimensions.

Similarly, many aspects of the embodiments discussed above can be altered while still providing similar benefits for separating compartments of an enclosure. For example, components in some embodiments can have differently shaped or arranged adjustable portions, different ranges of adjustable movement, differently shaped or arranged breakaway tabs or cutouts, and so on. As another example, some arrangements discussed above include slidable connections in which a pin on a first component engages an elongated opening on another component or a fastener is configured to extend through openings on multiple components, at least one of which is an elongated opening. In other embodiments, reversed or interchanged configurations to this effect are possible, such as configurations in which a fastener is replaced by a pin formed on a particular component, or configurations in which a component illustrated above as having an elongated opening is instead equipped with a pin (or fastener) that engages an elongated opening on another component.

Thus, embodiments of the disclosure provide for an improved mounting arrangement for securing a panel within an enclosure. The disclosed mounting arrangement, and corresponding methods, can provide for highly customizable mounting of panels at different locations and orientations within an enclosure. Further, the disclosed mounting arrangement, including as used in the disclosed methods, can provide for a connection between an enclosure frame and multiple points on a panel that is relatively strong in comparison to conventional arrangements.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

The invention claimed is:

1. An adjustable barrier assembly for an enclosure that has any of a plurality of enclosure depths and enclosure heights, the adjustable barrier assembly comprising:
    a top support bracket configured to be secured to the enclosure;
    a bottom support bracket configured to be secured to the enclosure;
    a barrier panel assembly including a first barrier panel and a second barrier panel, the second barrier panel slidably secured to the first barrier panel to selectively accommodate the plurality of enclosure depths;
    an upper barrier plate comprising:
        a first elongated upper-plate mounting hole that extends vertically and is configured to secure the upper barrier plate to the top support bracket to selectively accommodate the plurality of enclosure heights; and
        a flange configured to secure a first end of the barrier panel assembly;
    a lower barrier plate comprising:
        a first elongated lower-plate mounting hole that extends vertically and is configured to secure the lower barrier plate to the bottom support bracket to selectively accommodate the plurality of enclosure heights; and
        an upstanding wall having slots at a base thereof to secure a second end of the barrier panel assembly;
    the barrier panel assembly, the upper barrier plate, and the lower barrier plate being configured to collectively adjustably divide the enclosure into separate interior portions.

2. The adjustable barrier assembly of claim 1, wherein the first barrier panel includes one or more of:
    tabs that are dimensioned to be received by the slots of the lower barrier plate; or
    spring-loaded pins that are configured to engage the flange of the upper barrier plate.

3. The adjustable barrier assembly of claim 1, wherein one or more of the upper barrier plate or the lower barrier plate includes a tab configured to be bent or broken to provide an opening between the separate interior portions of the enclosure.

4. The adjustable barrier assembly of claim 1, wherein the top support bracket includes a base arm and a support arm;
    wherein the base arm is configured to engage either of a removable centerpost of the enclosure and an anchor bracket that is configured to be secured to a welded centerpost of the enclosure;
    wherein the support arm is configured to engage the upper barrier plate via the first elongated upper-plate mounting hole to secure the upper barrier plate to the removable or welded centerpost; and
    wherein the base arm is vertically offset from the support arm.

5. The adjustable barrier assembly of claim 1, wherein the bottom support bracket includes a base flange and a first support arm;
    wherein the base flange is configured to engage either of a removable centerpost of the enclosure and an anchor bracket that is configured to be secured to a welded centerpost of the enclosure; and
    wherein the first support arm is configured to engage the lower barrier plate via the first elongated lower-plate mounting hole to secure the lower barrier plate to the removable or welded centerpost.

6. The adjustable barrier assembly of claim 5, wherein the bottom support bracket further includes a second support arm; and
    wherein the bottom support bracket is a reversible bracket that is configured to be installed in either of a first configuration or a second configuration, in which, respectively, the first support arm adjustably secures the lower barrier plate via the first elongated lower-plate mounting hole and the second support arm adjustably secures the lower barrier plate via a second elongated lower-plate mounting hole that is vertically offset from the first elongated lower-plate mounting hole.

7. The adjustable barrier assembly of claim 6, wherein the second support arm includes a notch configured to provide clearance for slidable adjustment of the second barrier panel relative to the first barrier panel.

8. The adjustable barrier assembly of claim 1, further comprising:
    an anchor bracket configured to secure at least one of the top support bracket and a bottom support bracket to a welded centerpost of the enclosure.

9. The adjustable barrier assembly of claim 8, wherein the anchor bracket is a reversible bracket that is configured to be installed in either of a first configuration or a second configuration, in which, respectively, the anchor bracket secures the top support bracket to the welded centerpost of the enclosure and secures the bottom support bracket to the welded centerpost of the enclosure.

10. The adjustable barrier assembly of claim 1, further comprising:

an inner support bracket configured having a plurality of mounting holes to engage the barrier panel assembly and an inner surface of an enclosure; and an inner support anchor configured to secure the inner support bracket to a welded centerpost of the enclosure.

11. An adjustable barrier assembly for selective use with any of a plurality of enclosures, the adjustable barrier assembly comprising:

a first barrier panel;

a second barrier panel slidably secured to the first barrier panel to selectively accommodate multiple enclosure depths;

a top support bracket configured to be secured at a top portion of an enclosure;

an upper barrier plate secured to the top support bracket using elongated mounting holes to selectively accommodate multiple enclosure top-portion heights;

a bottom support bracket configured to be secured at a bottom portion of the enclosure; and a lower barrier plate secured to the bottom support bracket using elongated mounting holes to selectively accommodate multiple enclosure bottom-portion heights;

the first barrier panel being configured to be secured to the upper and lower barrier plates after the top and bottom support brackets secure the upper and lower barrier plates within the enclosure.

12. The adjustable barrier assembly of claim 11, wherein the lower barrier plate includes a slidable panel configured to selectively accommodate a back panel at the bottom portion of the enclosure.

13. The adjustable barrier assembly of claim 11, wherein the lower barrier plate includes an upstanding wall configured to guide tabs disposed on the first barrier panel into slots disposed at a base of the upstanding wall.

14. The adjustable barrier assembly of claim 13, wherein the upstanding wall includes a top flange configured to support the second barrier panel.

15. The adjustable barrier assembly of claim 11, wherein a top portion of the upper barrier plate includes a bent tab that provides a top channel across an interior of the enclosure.

16. The adjustable barrier assembly of claim 11, wherein the first barrier panel includes a notch configured to provide clearance for an enclosure handle within an interior of the enclosure.

17. The adjustable barrier assembly of claim 11, wherein the bottom support bracket is reversible and includes a first support arm, a second support arm, and a base flange extending between the first and second support arms.

18. The adjustable barrier assembly of claim 17, wherein the second support arm includes a notch dimensioned to accommodate the second barrier panel when the second barrier panel is retracted with respect to the first barrier panel.

19. A method of installing an adjustable barrier in an enclosure, the method comprising:

securing a base arm of a top support bracket to a centerpost of an enclosure at a top portion of the enclosure;

securing an upper barrier plate to a support arm of the top support bracket so that the upper barrier plate extends substantially fully across a top-portion depth of the enclosure above a top of the centerpost of the enclosure;

securing a base flange of a bottom support bracket to the centerpost of the enclosure at a bottom portion of the enclosure;

securing a lower barrier plate to a support arm of the bottom support bracket such that the lower barrier plate extends substantially fully across a bottom-portion depth of the enclosure below a bottom of the centerpost of the enclosure;

inserting tabs of a first barrier panel into slots disposed in the lower barrier plate;

pivoting the first barrier panel relative to the tabs to engage pins of the first barrier panel with recesses disposed in the upper barrier plate; and adjusting a second barrier panel that is slidably engaged with the first barrier panel such that the first barrier panel and the second barrier panel together extend substantially fully across a middle-portion depth of the enclosure.

20. The method of claim 19, wherein the upper barrier plate is configured to be adjustably secured to the top support bracket to extend by a select one of a plurality of first distances above the top of the centerpost of the enclosure; and wherein the second barrier panel is configured to be adjustably secured to the bottom support bracket to extend by a select one of a plurality of second distances below the bottom of the centerpost of the enclosure.

* * * * *